(12) United States Patent
Han

(10) Patent No.: US 9,741,415 B2
(45) Date of Patent: Aug. 22, 2017

(54) MAGNETIC DEVICES HAVING INSULATING SPACER THAT SURROUNDS PORTION OF WIRING STRUCTURE AND VARIABLE RESISTANCE STRUCTURE AND METHODS OF MANUFACTURING THE SAME

(71) Applicant: Yoon-sung Han, Seoul (KR)

(72) Inventor: Yoon-sung Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/085,230

(22) Filed: Mar. 30, 2016

(65) Prior Publication Data

US 2017/0062031 A1 Mar. 2, 2017

(30) Foreign Application Priority Data

Aug. 25, 2015 (KR) .................. 10-2015-0119819

(51) Int. Cl.
*H01L 27/22* (2006.01)
*G11C 11/16* (2006.01)
(Continued)

(52) U.S. Cl.
CPC .............. *G11C 11/161* (2013.01); *G11C 5/06* (2013.01); *G11C 11/1673* (2013.01); *H01L 23/528* (2013.01); *H01L 27/222* (2013.01); *H01L 27/228* (2013.01); *H01L 43/02* (2013.01); *H01L 43/08* (2013.01); *H01L 43/12* (2013.01); *H01L 23/5228* (2013.01)

(58) Field of Classification Search
CPC . H01L 23/5228; H01L 27/222; H01L 27/228; H01L 27/2454; H01L 43/02; H01L 43/08; H01L 43/12; G11C 11/161
See application file for complete search history.

(56) References Cited

U.S. PATENT DOCUMENTS 6,783,995 B2 * 8/2004 Hineman ............... B82Y 25/00
257/E27.005
7,042,025 B2 5/2006 Butcher et al.
(Continued)

FOREIGN PATENT DOCUMENTS

JP 2013-065756 A 4/2013
JP 2013-201343 A 10/2013
KR 10-2006-0036669 A 5/2006

*Primary Examiner* — Stephen W Smoot
(74) *Attorney, Agent, or Firm* — Harness, Dickey & Pierce P.L.C.

(57) ABSTRACT

Disclosed are a magnetic device and a method of manufacturing the same. The magnetic device includes an insulation spacer that surrounds a portion of a wiring structure and a variable resistance structure. In order to manufacture the magnetic device, a magnetic resistance element and an electrode covering the magnetic resistance element are formed on a substrate by using a sacrificial mask pattern as an etch mask, and then, an insulation spacer that surrounds the magnetic resistance element, the electrode, and the sacrificial mask pattern and exposes the sacrificial mask pattern is formed. A contact space that is limited by the insulation spacer and exposes the electrode is provided by removing the sacrificial mask pattern. A conductive pattern contacting the electrode is formed in the contact space.

15 Claims, 27 Drawing Sheets

(51) Int. Cl.
*G11C 5/06* (2006.01)
*H01L 43/02* (2006.01)
*H01L 43/08* (2006.01)
*H01L 43/12* (2006.01)
*H01L 23/528* (2006.01)
*H01L 23/522* (2006.01)

(56) References Cited

U.S. PATENT DOCUMENTS

| | | |
|---|---|---|
| 8,772,888 B2 | 7/2014 | Jung et al. |
| 2004/0191928 A1* | 9/2004 | Shi ................. H01L 27/228 438/3 |
| 2005/0090119 A1* | 4/2005 | Lee .................. H01L 43/12 438/720 |
| 2007/0181964 A1 | 8/2007 | Shoji |
| 2008/0003701 A1* | 1/2008 | Chen ................ H01L 43/12 438/3 |
| 2013/0037896 A1 | 2/2013 | Park et al. |
| 2014/0167191 A1 | 6/2014 | Doyle et al. |
| 2015/0021725 A1 | 1/2015 | Hsu et al. |
| 2015/0061051 A1 | 3/2015 | Huang et al. |
| 2016/0268505 A1* | 9/2016 | Sung ................ H01L 45/1233 |

\* cited by examiner

MAGNETIC DEVICES HAVING INSULATING SPACER THAT SURROUNDS PORTION OF WIRING STRUCTURE AND VARIABLE RESISTANCE STRUCTURE AND METHODS OF MANUFACTURING THE SAME

CROSS-REFERENCE TO RELATED APPLICATION

This application claims priority under 35 U.S.C. §119 to Korean Patent Application No. 10-2015-0119819, filed on Aug. 25, 2015, in the Korean Intellectual Property Office, the disclosure of which is incorporated herein in its entirety by reference.

BACKGROUND

Field

One or more example embodiments of inventive concepts relate to semiconductor devices and/or methods, for example, magnetic devices and/or methods of manufacturing the same, for example, magnetic devices including magnetic tunnel junction (MTJ) cells having magnetic layers and upper wiring layers connected to the MTJ cells, and/or a methods of manufacturing the same.

Related Art

As semiconductor products become smaller, more highly integrated and multi-functional, relatively high-scale data must be processed in smaller areas. As a result, research into devices for increasing operating speed of memory devices applied to semiconductor products, and realizing a finer pattern for higher integration, has been conducted. In one example, as a plurality of MTJ cells of a magnetic random access memory (MRAM) devices are each patterned, a critical dimension and a pitch of the MTJ cells are reduced. For this reason, increases in height of a metal hard mask, which is used as an etch mask in a patterning process of forming an MTJ cell, are limited, and it may be relatively difficult to secure an etching process margin for exposing the metal hard mask in a subsequent process of forming a wire.

SUMMARY

One or more example embodiments of inventive concepts provide semiconductor devices, for example, magnetic devices having structures in which a metal hard mask with an increased height may be omitted when forming MTJ cells having a relatively fine size for implementing more highly integrated magnetic devices, and in which a more stable connection may be made between an upper electrode and a wiring structure formed on the upper electrode even when the upper electrode of each of the MTJ cells is formed to a reduced thickness for higher integration.

One or more example embodiments of inventive concepts also provide methods of manufacturing semiconductor devices, for example, magnetic devices in which a metal hard mask with an increased height may be omitted when forming MTJ cells having a relatively fine size for implementing more highly integrated magnetic devices, and which may provide a process margin for a more stable connection to be made between an upper electrode and a wiring structure formed on the upper electrode even when the upper electrode of each of the MTJ cells is formed to a reduced thickness necessary for higher integration.

At least one example embodiment provides a semiconductor device, for example, a magnetic device comprising: a variable resistance structure; a wiring structure connected to the variable resistance structure; and an insulation spacer surrounding a portion of the wiring structure and the variable resistance structure.

The variable resistance structure may include: a magnetic resistance element including a tunnel barrier; a first magnetization layer on a first side of the tunnel barrier; and a second magnetization layer on a second side of the tunnel barrier. The insulation spacer may surround the tunnel barrier, the first magnetization layer, the second magnetization layer, and the portion of the wiring structure.

The variable resistance structure may include: a magnetic resistance element; a lower electrode connected to a first end of the magnetic resistance element; and an upper electrode connected to a second end of the magnetic resistance element. The wiring structure may include a contact plug connected to the upper electrode. The insulation spacer may surround the magnetic resistance element, the upper electrode, and the contact plug.

The wiring structure may further include a conductive line spaced apart from the upper electrode; the contact plug may be between the conductive line and the upper electrode; the contact plug may contact the conductive line; and the insulation spacer may contact the conductive line.

The variable resistance structure may include: a magnetic resistance element; a lower electrode connected to a first end of the magnetic resistance element; and an upper electrode connected to a second end of the magnetic resistance element. The wiring structure may include a conductive line connected to the upper electrode. The insulation spacer may surround a portion of the conductive line, the magnetic resistance element, and the upper electrode.

The conductive line may include an upper line part having a planar surface and extending linearly. The upper line part may have a lower protrusion protruding from the upper line part toward the variable resistance structure. The insulation spacer may surround the lower protrusion, the magnetic resistance element, and the upper electrode.

At least one other example embodiment provides a semiconductor device, for example, a magnetic device comprising: a substrate having a plurality of active areas, the plurality of active areas extending in parallel along a first direction; a plurality of word lines in the plurality of active areas, the plurality of word lines extending along a second direction, the second direction intersecting the first direction; at least one source line connected to a plurality of first active areas among the plurality of active areas; a plurality of buried contact plugs connected to a plurality of second active areas among the plurality of active areas; a plurality of variable resistance structures connected to the plurality of second active areas through the plurality of buried contact plugs; a wiring structure connected to each of the plurality of variable resistance structures; and an insulation spacer surrounding a portion of the wiring structure and at least one of the plurality of variable resistance structures.

Each of the plurality of variable resistance structures may include a magnetic resistance element. The magnetic resistance element may include: a tunnel barrier; a first magnetization layer on a first side of the tunnel barrier; and a second magnetization layer on a second side of the tunnel barrier. The insulation spacer may surround the tunnel barrier, the first magnetization layer, the second magnetization layer, and a portion of the wiring structure.

The plurality of variable resistance structures may be aligned in a row along the first direction; and the wiring structure may include a conductive line extending along the first direction above the plurality of variable resistance structures. At least a portion of the conductive line may contact the insulation spacer.

Each of the plurality of variable resistance structures may include: a magnetic resistance element; a lower electrode connected to a first end of the magnetic resistance element; and an upper electrode connected to a second end of the magnetic resistance element. The wiring structure may include a plurality of contact plugs, wherein each of the plurality of contact plugs may be connected to an upper electrode of a corresponding variable resistance structure among the plurality of variable resistance structures. The insulation spacer may surround the plurality of contact plugs and the plurality of variable resistance structures.

The insulation spacer may include an integrated insulation spacer surrounding a pair of adjacent variable resistance structures from among the plurality of variable resistance structures and a pair of the plurality of contact plugs connected to the adjacent pair of variable resistance structures.

Each of the plurality of variable resistance structures may include: a magnetic resistance element; a lower electrode connected to a first end of the magnetic resistance element; and an upper electrode connected to a second end of the magnetic resistance element. The wiring structure may include: a plurality of contact plugs, each of the plurality of contact plugs connected to an upper electrode of a corresponding variable resistance structure among the plurality of variable resistance structures; and a bit line connected to the upper electrodes through the plurality of contact plugs. The insulation spacer may surround the plurality of contact plugs and the plurality of variable resistance structures. The insulation spacer may contact the bit line.

Each of the plurality of variable resistance structures may include: a magnetic resistance element; a lower electrode connected to a first end of the magnetic resistance element; and an upper electrode connected to a second end of the magnetic resistance element. The wiring structure may include a bit line connected to the upper electrode of each of the plurality of variable resistance structures; and the insulation spacer may surround a portion of the bit line and the magnetic resistance element and upper electrode of each of the plurality of variable resistance structures.

The bit line may directly contact the upper electrode of each of the plurality of variable resistance structures.

The bit line may include an upper line part having a planar surface and extending linearly, the upper line part having a plurality of lower protrusions protruding from the upper line part toward the upper electrodes of the plurality of variable resistance structures. The insulation spacer may surround at least one of the plurality of variable resistance structures and at least one of the plurality of lower protrusions.

At least one other example embodiment provides a method of manufacturing a semiconductor device, for example, a magnetic device, the method comprising: forming a stacked structure on a substrate, the stacked structure including a plurality of magnetic layers; forming a first conductive layer on the stacked structure; forming a sacrificial mask pattern on the first conductive layer; etching the first conductive layer and the stacked structure using the sacrificial mask pattern as an etch mask to form a magnetic resistance element and an electrode on the magnetic resistance element; forming an insulation spacer surrounding the magnetic resistance element, the electrode, and the sacrificial mask pattern; removing the sacrificial mask pattern to expose the electrode through a contact space in the insulation spacer; and forming a conductive pattern in the contact space, the conductive pattern contacting the electrode.

The magnetic resistance element may include a first magnetization layer, a tunnel barrier, and a second magnetization layer, which are sequentially stacked on one another; and the forming an insulation spacer may include forming an integrated insulation spacer surrounding the first magnetization layer, the tunnel barrier, the second magnetization layer, the electrode, and the sacrificial mask pattern. The sacrificial mask pattern and the insulation spacer may be formed of different materials.

The sacrificial mask pattern may include at least one of a polysilicon layer, nitride layer, and a carbon-containing layer; the insulation spacer may include at least one of aluminum oxide, silicon oxide, silicon nitride, silicon oxynitride, and a high-k dielectric film; and the sacrificial mask pattern and the insulation spacer may be formed of different materials.

The forming a conductive pattern may comprise: forming a second conductive layer to fill the contact space; and removing a portion of the second conductive layer such that a portion of the second conductive layer remains in the contact space.

The forming a conductive pattern may comprise: forming a conductive line above the insulation spacer; wherein the conductive line extends in parallel with the substrate, the conductive line covers a surface of the insulation spacer, and the conductive line fills the contact space.

At least one other example embodiment provides a method of manufacturing a semiconductor device, for example, a magnetic device, the method comprising: forming a plurality of contact plugs on a substrate including an active area, the plurality of contact plugs connected to the active area; forming a stacked structure on the plurality of contact plugs, the stacked structure including a plurality of magnetic layers; forming a conductive layer on the stacked structure; forming a sacrificial mask pattern on the conductive layer; etching the conductive layer and the stacked structure using the sacrificial mask pattern as an etch mask to form a plurality of magnetic resistance elements and a plurality of electrodes, each of the plurality of electrodes on a corresponding magnetic resistance element among the plurality of magnetic resistance elements; forming an insulation spacer surrounding the plurality of magnetic resistance elements, the plurality of electrodes, and portions of the sacrificial mask pattern; forming an insulation layer on the insulation spacer; removing a portion of the insulation layer and a portion of the insulation spacer to expose the portions of the sacrificial mask pattern; removing the portions of the sacrificial mask pattern to expose the plurality of electrodes through a plurality of contact spaces in the insulation spacer; and forming a wiring structure in the plurality of contact spaces.

The conductive layer may include metal; and the sacrificial mask pattern may not include metal.

The active area may extend along a first direction in the substrate, and the plurality of magnetic resistance elements may be formed in a row along the first direction.

The forming an insulation spacer may comprise: forming a single insulation spacer surrounding the plurality of magnetic resistance elements, the plurality of electrodes, and the portions of the sacrificial mask pattern.

The forming a wiring structure may comprises: forming a plurality of contact plugs in the plurality of contact spaces, each of the plurality of contact plugs contacting a corresponding one of the plurality of electrodes.

The forming of the wiring structure may comprise: forming a conductive line filling the plurality of contact spaces, the conductive line covering a surface of the insulation spacer and a surface of the insulation layer.

The conductive line may include an upper line part extending linearly and having a planar surface, the upper line part having a plurality of lower protrusions protruding from the upper line part toward the plurality of electrodes in the plurality of contact spaces. The insulation spacer may surround the plurality of lower protrusions, the plurality of magnetic resistance elements, and the plurality of electrodes.

The conductive line may extend in a direction parallel to the active area.

The forming a conductive line may comprise: forming the conductive line in the plurality of contact spaces, the conductive line contacting the plurality of electrodes.

At least one other example embodiment provides a method of manufacturing a semiconductor device, for example, a magnetic device including a variable resistance structure, the method comprising: forming a stacked magnetization layer structure on a first electrode layer; forming a second electrode layer on the stacked magnetization layer structure; forming a sacrificial mask layer pattern on the second electrode layer, at least a portion of the sacrificial mask layer pattern corresponding to at least a portion of the second electrode layer; etching the second electrode layer and the stacked magnetization layer structure using the sacrificial mask layer pattern as an etch mask to form the variable resistance structure, the portion of the second electrode layer forming an upper electrode of the variable resistance structure; and removing the sacrificial mask layer pattern to expose the upper electrode.

The method may further include: forming an insulation spacer surrounding the sacrificial mask layer pattern and the variable resistance structure, wherein the removing removes the sacrificial mask layer pattern to expose the upper electrode of the variable resistance structure in a contact space through the insulation spacer; and forming a conductive pattern to contact the upper electrode in the contact space.

The sacrificial mask layer pattern and the insulation spacer may be formed of different materials.

The forming an insulation spacer surrounding the sacrificial mask layer pattern and the variable resistance structure may comprise: forming an insulation spacer layer on a surface and sidewalls of the sacrificial mask layer pattern, and on sidewalls of the variable resistance structure; and planarizing the insulation spacer layer to remove an upper portion of the insulation spacer layer and expose the sacrificial mask layer pattern.

The second electrode layer may include metal, and the sacrificial mask layer pattern may not include metal.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
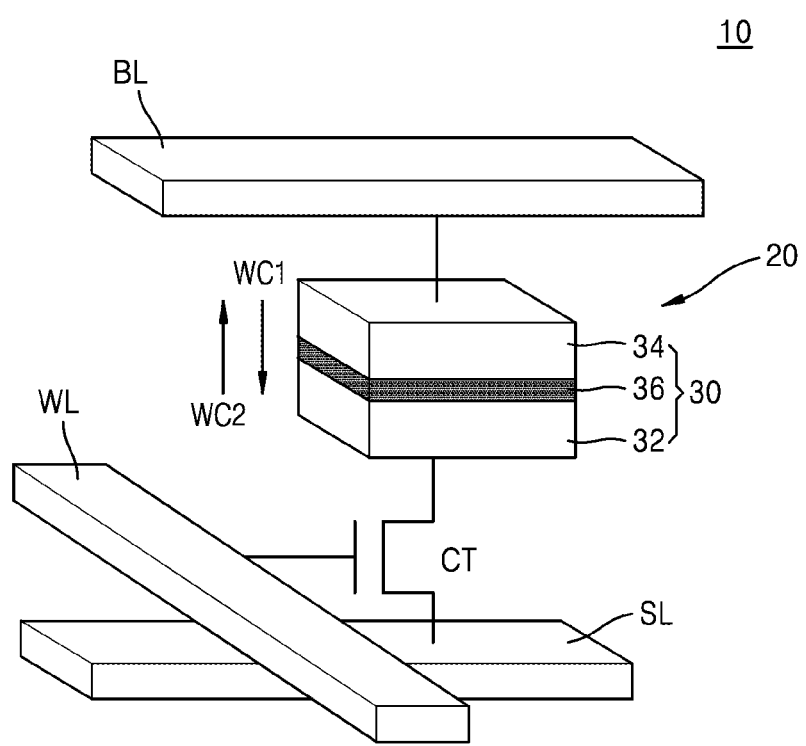
FIG. 1 is a diagram illustrating a schematic configuration of a magnetic device according to an example embodiment.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the accompanying drawings, for example, modifications of an illustrated shape may be expected according to manufacturing technology and/or a process difference. Therefore, embodiments of the inventive concept should not be construed as being limited to a specific shape of a region illustrated in the drawing, and for example, should include a shape change caused in a manufacturing process. The term "and/or" used herein includes a combination of one or more and each of described elements. Also, the term "substrate" used herein may denote a stacked structure which includes a substrate itself or includes the substrate and a certain layer or film formed on a surface thereof. Also, a surface of a substrate used herein may denote an exposed surface of the substrate itself or an outer surface of a certain layer or film formed on the substrate.

FIG. 1 is a diagram illustrating a schematic configuration of a magnetic device 10 according to an example embodiment. In FIG. 1, the magnetic device 10 including a memory cell 20 including a spin transfer torque magnetic random access memory (STT-MRAM) is illustrated.

The memory cell 20 may include an MTJ structure 30 and a cell transistor CT. A gate of the cell transistor CT may be connected to a word line WL. One electrode of the cell transistor CT may be connected to a bit line BL through the MTJ structure 30, and the other electrode of the cell transistor CT may be connected to a source line SL.

The MTJ structure 30 may include a free layer 32, a fixed layer 34, and a tunnel barrier 36 disposed there between. The free layer 32 may have a magnetization easy axis in a direction vertical to an extension direction of the free layer 32, and a magnetization direction of the free layer 32 may vary according to a condition. The fixed layer 34 may have a magnetization easy axis in a direction vertical to an extension direction of the fixed layer 34, and a magnetization direction of the fixed layer 34 may be fixed.

A resistance value of the MTJ structure 30 may be changed according to the magnetization direction of the free layer 32. When the magnetization direction of the free layer 32 is parallel to the magnetization direction of the fixed layer 34, the MTJ structure 30 may have a low resistance value and may store data "0". When the magnetization direction of the free layer 32 is antiparallel to the magnetization direction of the fixed layer 34, the MTJ structure 30 may have a high resistance value and may store data "1".

In FIG. 1, the arrangement of the free layer 32 and the fixed layer 34 is not limited thereto. Rather, a position of the free layer 32 and a position of the fixed layer 34 may switch there between.

In the magnetic device 10 of FIG. 1, for a writing operation of the STT-MRAM, the cell transistor CT may be turned on by applying a logic high voltage to the word line WL, and writing currents WC1 and WC2 may be applied between the bit line BL and the source line SL. In this case, the magnetization direction of the free layer 32 may be determined based on directions of the writing currents WC1 and WC2. In the MTJ structure 30, the magnetization direction of the free layer 32 may be changed by a spin transfer torque (STT).

In the magnetic device 10 of FIG. 1, for a reading operation of the STT-MRAM, the cell transistor CT may be turned on by applying a logic high voltage to the word line WL, and by applying a read current in a direction from the bit line BL to the source line SL, data stored in the MTJ structure 30 may be determined. In this case, an intensity of the read current may be weaker (e.g., far or substantially weaker) than those of the writing currents WC1 and WC2. Thus, the magnetization direction of the free layer 32 is not changed by the read current.

Figure 2:
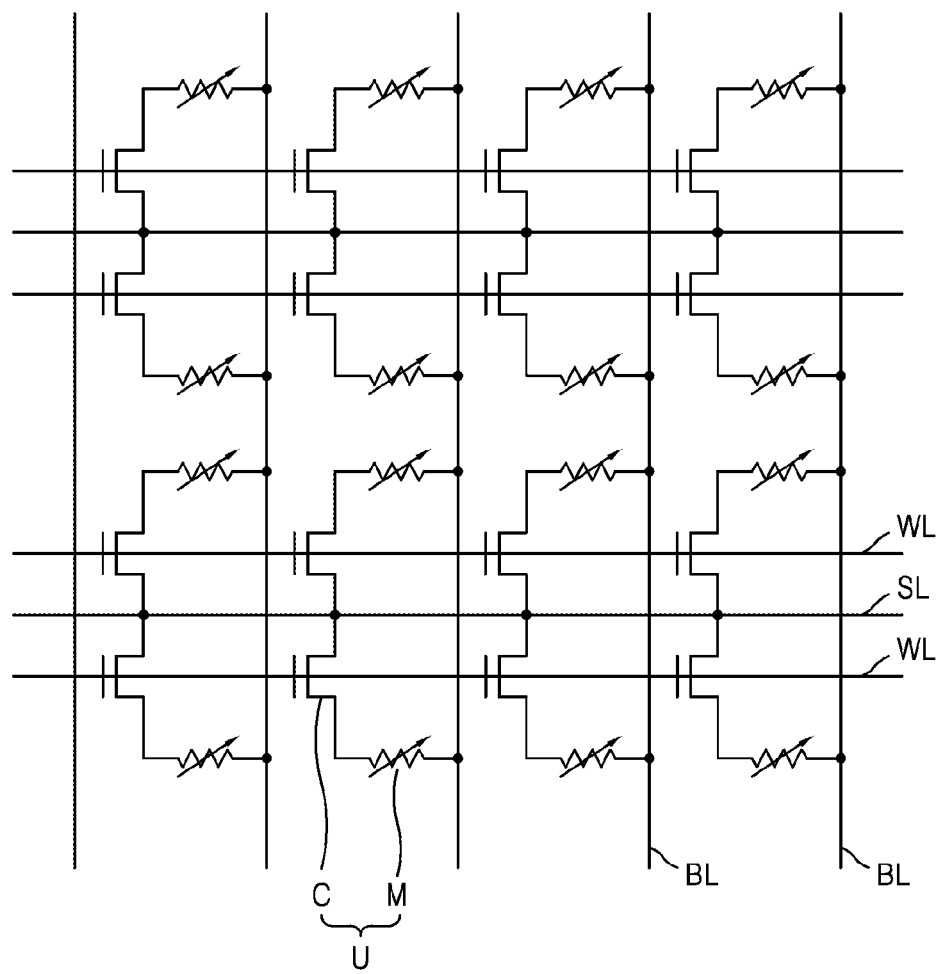
FIG. 2 is a schematic diagram illustrating a magnetic memory array of a magnetic device according to an example embodiment.

FIG. 2 is a schematic diagram illustrating a magnetic memory array of a magnetic device 50 according to an example embodiment.

Referring to FIG. 2, the magnetic memory array of the magnetic device 50 may include a plurality of unit cells U which are arranged in a matrix form. Each of the unit cells U may include an access unit C (also referred to herein as an access circuit) and a memory unit M (also referred to herein as a memory circuit). Each of the unit cells U may be electrically connected to a word line WL and a bit line BL. A plurality of word lines WL, which are arranged in parallel or substantially parallel, and a plurality of bit lines BL, which are arranged in parallel or substantially parallel, may be two-dimensionally arranged to intersect each other. In at least some example embodiments, the access unit C may include a transistor. Each of the unit cells U may correspond to the memory cell 20 of the magnetic device 10 illustrated in FIG. 1.

The source line SL may be connected to a source region of the access unit C. The access unit C may control the supply of a current to the memory unit M according to a voltage of the word line WL. The access unit C may correspond to the cell transistor CT of the magnetic device 10 illustrated in FIG. 1. In at least some example embodiments, the access unit C may be a MOS transistor, a bipolar transistor, a diode, etc.

The memory unit M may include a magnetic material. In at least some example embodiments, the memory unit M may include the MTJ structure 30 illustrated in FIG. 1. In at least some example embodiments, the memory unit M may perform a memory function by using an STT phenomenon where a magnetization direction of a magnetic substance is adjusted by an input current.

Figure 3A:
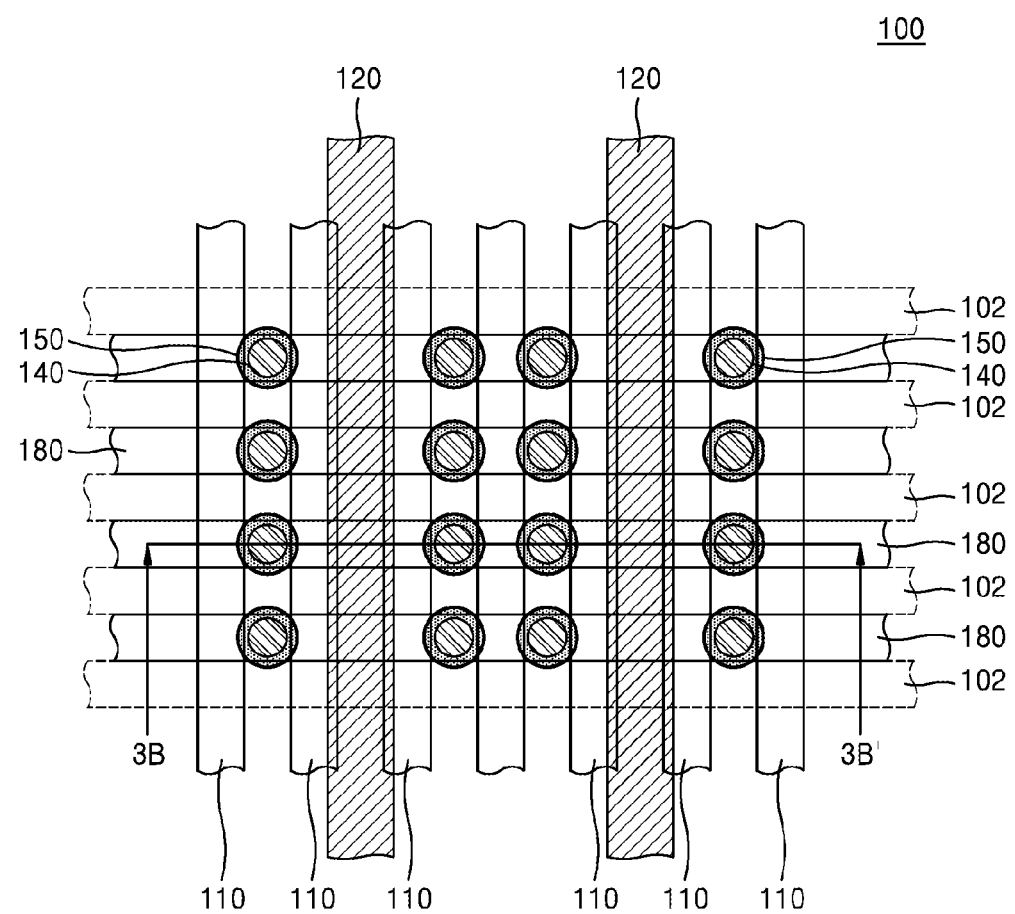
FIG. 3A is a schematic layout of a magnetic device according to an example embodiment.

FIG. 3A is a schematic layout of a magnetic device 100 according to an example embodiment. The layout of the magnetic device 100 illustrated in FIG. 3 may configure a portion of a memory cell array region of the magnetic device 50 illustrated in FIG. 2. The magnetic device 100 may be applied to, for example, a memory cell having a unit cell size of 6 F2 or 7 F2. Here, F denotes a minimum lithographic feature size.

Figure 3B:
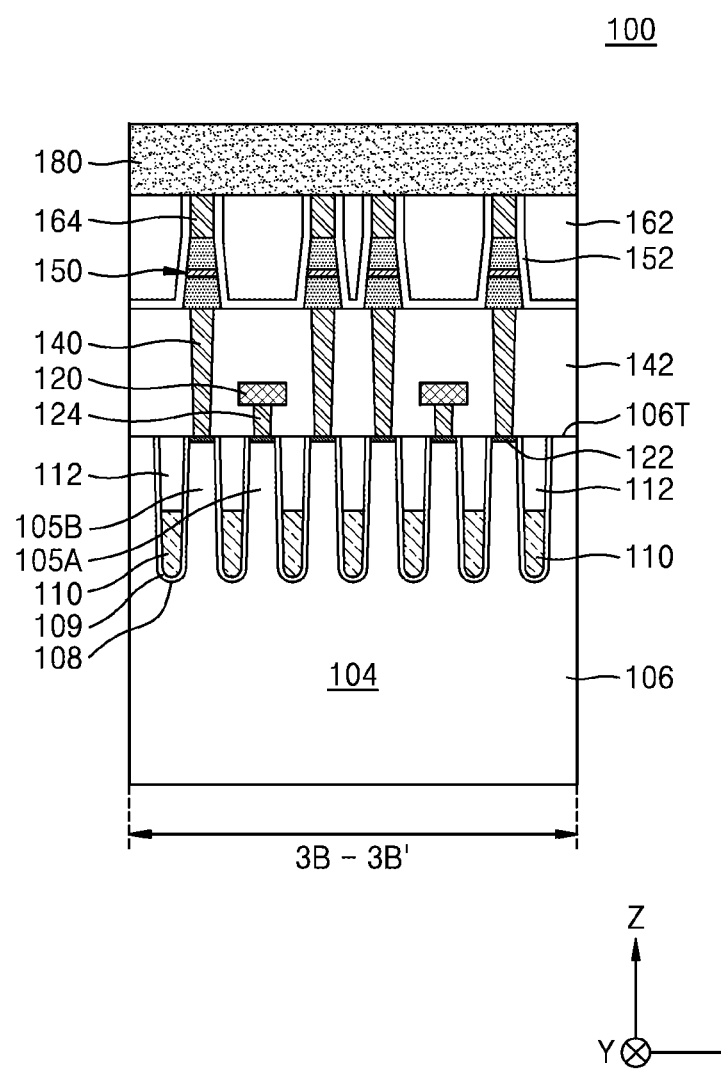
FIG. 3B is a cross-sectional view illustrating a schematic structure of a cross-section taken along line 3B-3B' of FIG. 3A.

FIG. 3B is a cross-sectional view illustrating a schematic structure of a cross-sectional surface taken along line 3B-3B' of FIG. 3A.

Referring to FIGS. 3A and 3B, the magnetic device 100 may include a substrate 106 on which a device isolation layer 102 is formed. A plurality of active areas 104, which extend in parallel or substantially parallel along a first direction (an X direction), may be defined on the substrate 106 by the device isolation layer 102.

The substrate 106 may include a semiconductor, such as silicon (Si), germanium (Ge), or the like, or a compound semiconductor such as SiGe, SiC, GaAs, InAs, InP, or the like. In at least some example embodiments, the substrate 106 may be formed of at least one of Group III-V material and Group IV material. The Group III-V material may be a binary, ternary, or quaternary compound including at least one Group III element and at least one Group V element. The Group III-V material may include a compound, which includes at least one of In, Ga, and Al, which are Group III elements, and at least one of As, P, and Sb, which are Group V elements. For example, the Group III-V material may be selected from InP, $In_zGa_{1-z}As$ ($0 \leq z \leq 1$), and $Al_zGa_{1-z}As$ ($0 \leq z \leq 1$). The binary compound may be, for example, one of InP, GaAs, InAs, InSb, and GaSb. The ternary compound may be one of InGaP, InGaAs, AlInAs, InGaSb, GaAsSb, and GaAsP. The Group IV material may be Si, Ge, or the like. However, the Group III-V material and the Group IV material available to an integration circuit device according to one or more example embodiments are not limited thereto.

A plurality of word lines 110 may extend along a second direction (a Y direction) intersecting the first direction in the plurality of active areas 104. The plurality of word lines 110 may be formed in a gate trench 108 formed on the substrate 106. A gate dielectric layer 109 disposed between the substrate 106 and the plurality of word lines 110 may be formed in the gate trench 108. A buried insulation layer 112 may be formed in the gate trench 108 on the plurality of word lines 110 to fill the gate trench 108.

In at least some example embodiments, each of the word lines 110 may include at least one material of a doped semiconductor, metal, conductive metal nitride, a metal-semiconductor compound, and the like.

In at least some example embodiments, the gate dielectric layer 109 may be formed of at least one material selected from among silicon oxide, silicon nitride, silicon oxynitride, oxide/nitride/oxide (ONO), a high-k dielectric film having a dielectric constant higher than that of silicon oxide, and the like.

In at least some example embodiments, the buried insulation layer 112 may include at least one of silicon nitride, silicon oxide, silicon oxynitride, and the like.

The plurality of word lines 110, as illustrated in FIG. 3B, may have a structure that is buried in the substrate 106 to have a top corresponding to a level lower than that of a top 106T of the substrate 106. However, inventive concepts should not be limited thereto. For example, the magnetic device 100 may include a plurality of word lines formed on the substrate 106.

A plurality of source lines 120 may extend in parallel or substantially parallel with the plurality of word lines 110 on the substrate 106. Each of the source lines 120 may be connected to the active area 104 between a pair of word lines 110 through a source line contact plug 124. In FIG. 3B, a case where the plurality of source lines 120 are formed on the substrate 106 is illustrated, but inventive concepts should not be limited thereto. For example, the magnetic device 100 may include a plurality of source lines buried in the substrate 106. The magnetic device 100 may include a plurality of source lines disposed on a level, which is higher than that of a pair of word lines 110, but is lower than that of the top 106T of the substrate 106. Also, in FIGS. 3A and 3B, it is illustrated that the plurality of source lines 120 extend in parallel or substantially parallel with the plurality of word lines 110, but inventive concepts should not be limited to the example embodiment illustrated in FIGS. 3A and 3B. For example, the plurality of source lines 120 may extend in a direction intersecting an extension direction of the word lines 110.

Each of the active areas 104 may include a plurality of first source/drain regions 105A and a plurality of second source/drain regions 105B. The plurality of source lines 120 may be connected to the first source/drain regions 105A in each of the active areas 104. A metal silicide layer 122 may be formed on a top of each of the first source/drain regions 105A and a top of each of the second source/drain regions 105B. The metal silicide layer 122 reduces a contact resistance between an upper conductive layer and the first source/drain regions 105A and second source/drain region 105B. However, according to at least this example embodiment, the metal silicide layer 122 may be omitted.

In the plurality of active areas 104, a plurality of buried contact plugs 140 passing through a first interlayer insulation layer 142 formed on the substrate 106 may be connected to the plurality of second source/drain regions 105B. The first interlayer insulation layer 142 may be formed of oxide, nitride, a combination thereof, or the like.

The plurality of source lines 120, the plurality of source line contact plugs 124, and the plurality of buried contact plugs 140 may be insulated from each other by the first interlayer insulation layer 142.

A plurality of variable resistance structures 150 may be formed on the plurality of buried contact plugs 140. The plurality of variable resistance structures 150 may be separated from each other with an insulation spacer 152 and a second interlayer insulation layer 162 there between, wherein the insulation spacer 152 surrounds each of the variable resistance structures 150 and the second interlayer insulation layer 162 covers the insulation spacer 152. The second interlayer insulation layer 162 may be formed of oxide, nitride, or a combination thereof.

The plurality of variable resistance structures 150 may be connected to the plurality of second source/drain regions 105B through the plurality of buried contact plugs 140.

As illustrated in FIG. 3A, the plurality of buried contact plugs 140 may include a series of buried contact plugs 140, which are arranged in one row along an extension direction (the X direction) of the active area 104, and the plurality of variable resistance structures 150 may include a series of variable resistance structures 150, which are arranged in one row along the extension direction (the X direction) of the active area 104. Also, the plurality of buried contact plugs 140 may include a series of buried contact plugs 140, which are arranged in one row along an extension direction of the source line 120, and the plurality of variable resistance structures 150 may include a series of variable resistance structures 150, which are arranged in one row along the extension direction of the source line 120. However, inventive concepts should not be limited to a planar or substantially planar structure illustrated in FIG. 3A. For example, the plurality of buried contact plugs 140 and the plurality of variable resistance structures 150 may be cornerwise arranged in zigzags along the extension direction of the source line 120.

A wiring structure 164 and 180 may be formed on the plurality of variable resistance structures 150. The wiring structure 164 and 180 may include a plurality of contact plugs 164 and a plurality of bit lines 180. The plurality of bit lines 180 may extend in parallel or substantially parallel in the first direction (the X direction) and may be electrically connected to the plurality of variable resistance structures 150 through the plurality of contact plugs 164. Each of the bit lines 180 may be connected to a corresponding second source/drain region 105B through a corresponding variable resistance structure 150 and a corresponding buried contact plug 140.

In at least some example embodiments, the plurality of bit lines 180 may each include at least one material including a metal, a conductive metal compound, a metal-semiconductor compound, a doped semiconductor, and the like. For example, the plurality of bit lines 180 may each include a barrier layer, which is formed of tantalum (Ta), titanium (Ti), TaN, TiN, or a combination thereof, and a metal layer (for example, a copper (Cu) layer) formed on the barrier layer.

Each of the variable resistance structures 150 may store data depending on a resistance state thereof between a corresponding bit line 180 and a corresponding contact plug 140. The plurality of variable resistance structures 150 may each include the MTJ structure 30 of the magnetic device 10 illustrated in FIG. 1.

The insulation spacer 152 may surround the plurality of variable resistance structures 150 and the plurality of contact plugs 164. A top of the insulation spacer 152 may contact a bottom of each of the bit lines 180. In at least some example embodiments, the top of the insulation spacer 152 may be formed to be spaced apart from each of the bit lines 180.

In at least some example embodiments, the insulation spacer 152 may have an integrated structure, which surrounds the plurality of variable resistance structures 150 and the plurality of contact plugs 164, on the first interlayer insulation layer 142. In at least some other example embodiments, the insulation spacer 152 may include a plurality of insulation spacers 152, which surround one variable resistance structures 150 and one contact plugs 164, on the first interlayer insulation layer 142. In at least some other example embodiments, the insulation spacer 152 may include an integrated insulation layer, which surrounds a pair of variable resistance structures 150 adjacent to each other among the plurality of variable resistance structures 150 and a pair of contact plugs 164 connected to the pair of variable resistance structure 150 among the plurality of contact plugs 164. In at least some other example embodiments, the insulation spacer 152 may include a plurality of insulation spacers 152, which surround a plurality of variable resistance structures 150 (e.g., four variable resistance structures 150) and a plurality of contact plugs 164 (e.g., four contact plugs 164), on the first interlayer insulation layer 142. However, inventive concepts should not be limited to these examples.

Figure 4:
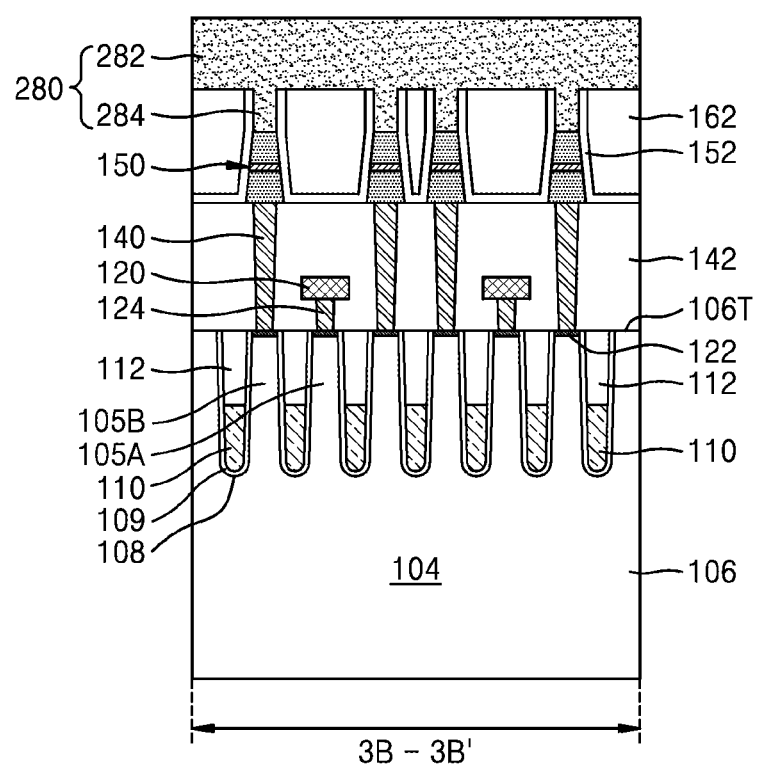
FIG. 4 is a cross-sectional view of a magnetic device according to another example embodiment.

FIG. 4 is a cross-sectional view of a magnetic device 200 according to another example embodiment. In FIG. 4, reference numerals that are the same as reference numerals illustrated in FIGS. 3A and 3B refer to like elements, and their detailed descriptions are not repeated.

Referring to FIG. 4, the magnetic device 200 may be similar to the magnetic device 100 illustrated in FIGS. 3A and 3B, except that the magnetic device 200 may include a bit line 280, which directly contacts a plurality of variable resistance structures 150.

A portion of the bit line 280 may be surrounded by one insulation spacer 152 along with a corresponding variable resistance structure 150.

The bit line 280 may include an upper bit line part 282, which includes a flat top and linearly extends, and a plurality of lower protrusion bit line parts 284, which are connected to the upper bit line part 282 as one body and protrude in a direction from the upper bit line part 282 to the plurality of variable resistance structures 150 with respect to a position facing the plurality of variable resistance structures 150.

The insulation spacer 152 may surround at least one of the plurality of variable resistance structures 150 and at least one of the plurality of lower protrusion bit line parts 284. A top of the insulation spacer 152 may contact a bottom of the upper bit line part 282. In at least some other example embodiments, the top of the insulation spacer 152 may be formed to be spaced apart from the upper bit line 282.

The bit line 280 may include at least one of metal, a conductive metal compound, a metal-semiconductor compound, a doped semiconductor, and the like. For example, the plurality of bit lines 180 may each include a barrier layer, which is formed of tantalum (Ta), titanium (Ti), TaN, TiN, or a combination thereof, and a metal layer (e.g., a Cu layer) formed on the barrier layer.

Figure 5A:
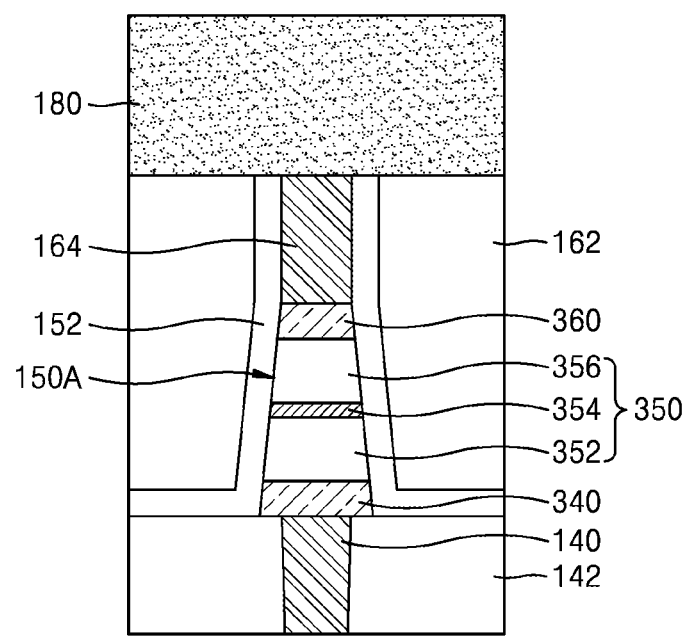
FIG. 5A is a cross-sectional view of a portion of a magnetic device including a variable resistance structure according to an example embodiment.

FIG. 5A is a cross-sectional view of a magnetic device 300A including a variable resistance structure 150A according to an example embodiment.

In at least one example embodiment, each of the variable resistance structures 150 included in the magnetic device 100 illustrated in FIGS. 3A and 3B may have a structure, which is the same as, or similar to, the variable resistance structure 150A illustrated in FIG. 5A.

The variable resistance structure 150A may include a lower electrode 340, an upper electrode 360, and a magnetic resistance element 350 disposed between the lower electrode 340 and the upper electrode 360. The magnetic resistance element 350 may include a tunnel barrier 354, a first magnetization layer 352 disposed on one side of the tunnel barrier 354, and a second magnetization layer 356 disposed on the other side of the tunnel barrier 354.

One of the first and second magnetization layers 352 and 356 may include a fixed layer, and the other may include a free layer. However, inventive concepts should not be limited to this example. For example, the first magnetization layer 352 or the second magnetization layer 356 may include at least one fixed layer and at least one free layer. The fixed layer may have a magnetization easy axis in a direction vertical to a layer surface, and a magnetization direction of the fixed layer may be fixed. The free layer may have a magnetization easy axis in a direction vertical to a layer surface, and a magnetization direction of the free layer may vary depending on conditions.

Moreover, in FIG. 5A, a configuration where one tunnel barrier 354 is provided is illustrated. However, inventive concepts should not be limited to this example. In at least some other example embodiments, a multilayer tunnel barrier may be provided between the lower electrode 340 and the upper electrode 360.

A resistance value of a magnetic tunnel junction of the variable resistance structure 150A may be changed according to a magnetization direction of each of the first magnetization layer 352 and the second magnetization layer 356. For example, when the magnetization direction of the first magnetization layer 352 is antiparallel to the magnetization direction of the second magnetization layer 356, the variable resistance structure 150A may have a relatively high resistance value and may store data "1". When the magnetization direction of the first magnetization layer 352 is parallel to the magnetization direction of the second magnetization layer 356, the variable resistance structure 150A may have a relatively low resistance value and may store data "0". Data may be written or read in or from the magnetic device 300A by using a difference between the resistance values.

In at least some example embodiments, the variable resistance structure 150A may be used to implement a MTJ device having a vertical magnetization type. In at least some example embodiments, a magnetization direction of a free layer of the variable resistance structure 150A may be changed based on a spin transfer torque (STT).

In at least some other example embodiments, the variable resistance structure 150A may include a horizontal MTJ structure where a moving direction of a current is vertical or substantially vertical relative to a magnetization easy axis.

The lower electrode 340 and the upper electrode 360 may each include a conductive material which is relatively low in reactivity. In at least some example embodiments, the lower electrode 340 and the upper electrode 360 may each include conductive metal nitride. For example, the lower electrode 340 and the upper electrode 360 may each include a single layer, which is formed of at least one material selected from among titanium (Ti), tantalum (Ta), ruthenium (Ru), TiN, TaN, and tungsten (W), or a multilayer structure including a plurality of materials.

The tunnel barrier 354 may have a thickness that is less than a spin diffusion distance. The tunnel barrier 354 may include a nonmagnetic material. In at least some example embodiments, the tunnel barrier 354 may be formed of a material selected from among Mg, Ti, Al, MgZn, MgB, and the like. In at least some other example embodiments, the tunnel barrier 354 may be formed of Ti nitride, vanadium (V) nitride, or the like.

In at least some example embodiments, at least one of the first magnetization layer 352 and the second magnetization layer 356 may include at least one material selected from among iron (Fe), cobalt (Co), nickel (Ni), palladium (Pd), platinum (Pt), and the like. In at least some example embodiments, at least one of the first magnetization layer 352 and the second magnetization layer 356 may be formed of a Co-M1 alloy (where M1 is at least one metal selected from among Pt, Pd, and Ni) or a Fe-M2 alloy (where M2 is at least one metal selected from among Pt, Pd, and Ni). In at least some example embodiments, at least one of the first magnetization layer 352 and the second magnetization layer 356 may further include boron (B), carbon (C), copper (Cu), silver (Ag), gold (Au), ruthenium (Ru), tantalum (Ta), and/or chromium (Cr).

In at least some example embodiments, at least one of the first magnetization layer 352 and the second magnetization layer 356 may include a perpendicular magnetic anisotropy (PMA) material. In at least some example embodiments, at least one of the first magnetization layer 352 and the second magnetization layer 356 may include a synthetic anti-ferromagnetic (SAF) structure. The SAF structure may be a structure where a Ru intermediate layer is inserted into a ferromagnetic material-stacked structure. For example, the SAF structure may include a multilayer structure including CoFeB/Ta/(Co/Pt)m/Ru/(Co/Pd)n (where m is a natural number, and n is a natural number). The SAF structure applied to the magnetic device according to one or more example embodiments should not be limited thereto, and may be variously modified.

In the magnetic device 300A illustrated in FIG. 5A, the insulation spacer 152 may surround the variable resistance structure 150A and the contact plug 164, which is formed on the variable resistance structure 150A and is a portion of the wiring structure 164 and 180 connected to a top of the variable resistance structure 150A. Therefore, the magnetic resistance element 350 of the variable resistance structure 150A, the lower electrode 340 connected to one end of the magnetic resistance element 350, and the upper electrode 360 connected to the other end of the magnetic resistance element 350 may be surrounded by one insulation spacer 152 along with the contact plug 164. A top of the insulation spacer 152 and a top of the contact plug 164 may be disposed on the same or substantially the same level. The top of the insulation spacer 152 may contact a bottom of the bit line 180.

Figure 5B:
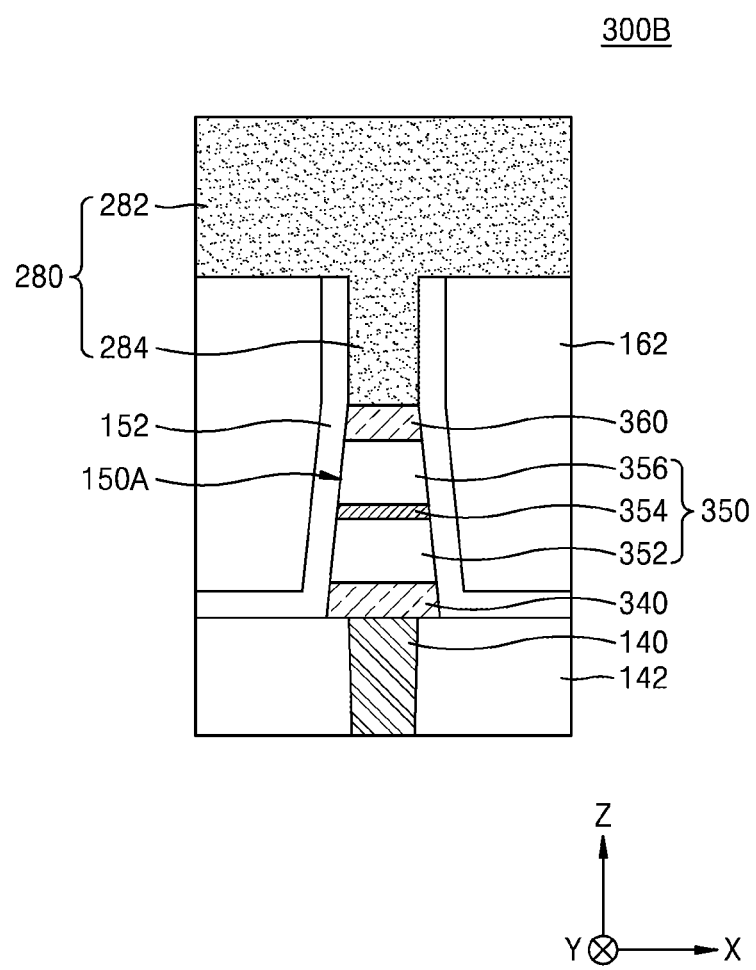
FIG. 5B is a cross-sectional view of a portion of a magnetic device including a variable resistance structure according to an example embodiment.

FIG. 5B is a cross-sectional view of a magnetic device 300B including a variable resistance structure 150A according to an example embodiment.

In at least one example embodiment, each of the variable resistance structures 150 included in the magnetic device 200 illustrated in FIG. 4 may have a structure, which is the same as, or similar to, the variable resistance structure 150A having a structure illustrated in FIG. 5B. The description of FIG. 5A may be applied to the variable resistance structure 150A.

In the magnetic device 300B illustrated in FIG. 5B, a bit line 280 may include an upper bit line part 282, which has a flat top and extends linearly, and a lower protrusion bit line part 284, which is connected to the upper bit line part 282 as one body and protrudes in a direction from the upper bit line part 282 to the variable resistance structure 150A with respect to a position facing the variable resistance structure 150A. The lower protrusion bit line part 284 of the bit line 280 may be surrounded by one insulation spacer 152 along with a magnetic resistance element 350 of the variable resistance structure 150A, a lower electrode 340 connected to one end of the magnetic resistance element 350, and an upper electrode 360 connected to the other end of the magnetic resistance element 350.

FIGS. 6 to 9 are cross-sectional views for describing example variable resistance structures included in a magnetic device according to an example embodiment. In FIGS. 6 to 9, reference numerals that are the same as reference numerals illustrated in FIGS. 5A and 5B refer to like elements, and their detailed descriptions are not repeated.

Figure 6:
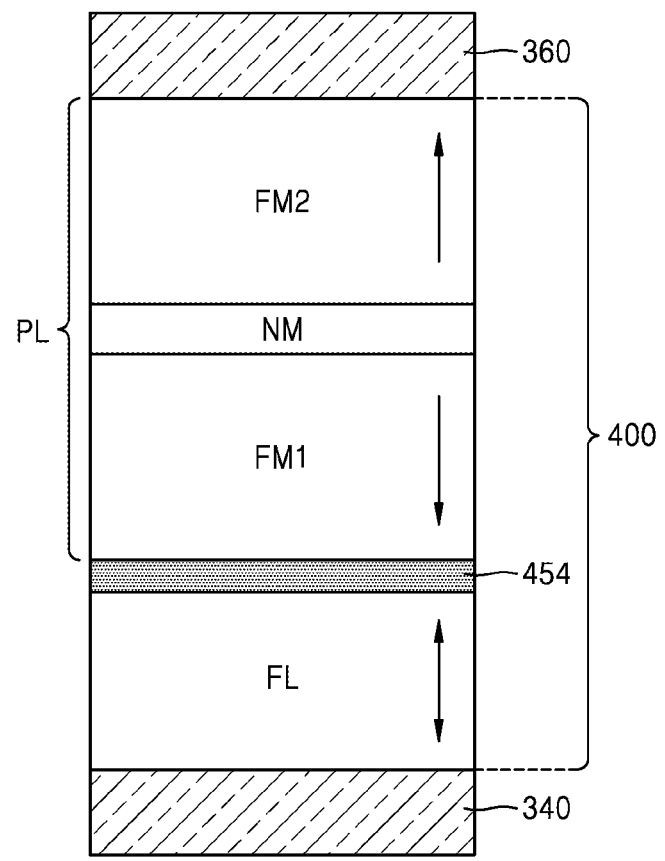
FIGS. 6 to 9 are cross-sectional views for describing a plurality of variable resistance structures according to example embodiments.

Referring to FIG. 6, a magnetic device according to example embodiments may include a variable resistance structure 150B.

In at least some example embodiments, the variable resistance structures 150A of the magnetic device 100 illustrated in FIGS. 3A and 3B or the variable resistance structures 150 of the magnetic device 200 illustrated in FIG. 4 may be configured as the variable resistance structure 150B illustrated in FIG. 6.

The variable resistance structure 150B may include a magnetic resistance element 400 disposed between a lower electrode 340 and an upper electrode 360. The magnetic resistance element 400 may include a free layer FL, a fixed layer PL having the SAF structure, and a tunnel barrier 454 disposed there between.

The fixed layer PL may include two ferromagnetic layers FM1 and FM2, which are separated from each other by a relatively thin nonmagnetic layer NM. The SAF structure may have antiferromagnetic coupling characteristic due to Ruderman-Kittel-Kasuya-Yosida (RKKY) interaction based on the relatively thin nonmagnetic layer NM inserted between the two ferromagnetic layers FM1 and FM2. Magnetic domains of the ferromagnetic layers FM1 and FM2 may be aligned in an opposite direction due to antiferromagnetic coupling between the two ferromagnetic layers FM1 and FM2.

When a magnetic field applied from the outside to the free layer FL gradually increases and reaches a switching field, which is a threshold value of magnetization reversal, an electric resistance value may be sequentially changed due to the magnetization reversal.

In at least some example embodiments, the ferromagnetic layers FM1 and FM2 may each be formed of CoFeB, CoFe, NiFe, FePt, CoPt, and/or the like. The relatively thin antiferromagnetic layer NM may include a metal (e.g., a single metal) selected from the group including Ru, Cr, Pt, Pd, Ir, Rh, Ru, Os, Re, Au, Cu, or an alloy thereof.

Figure 7:
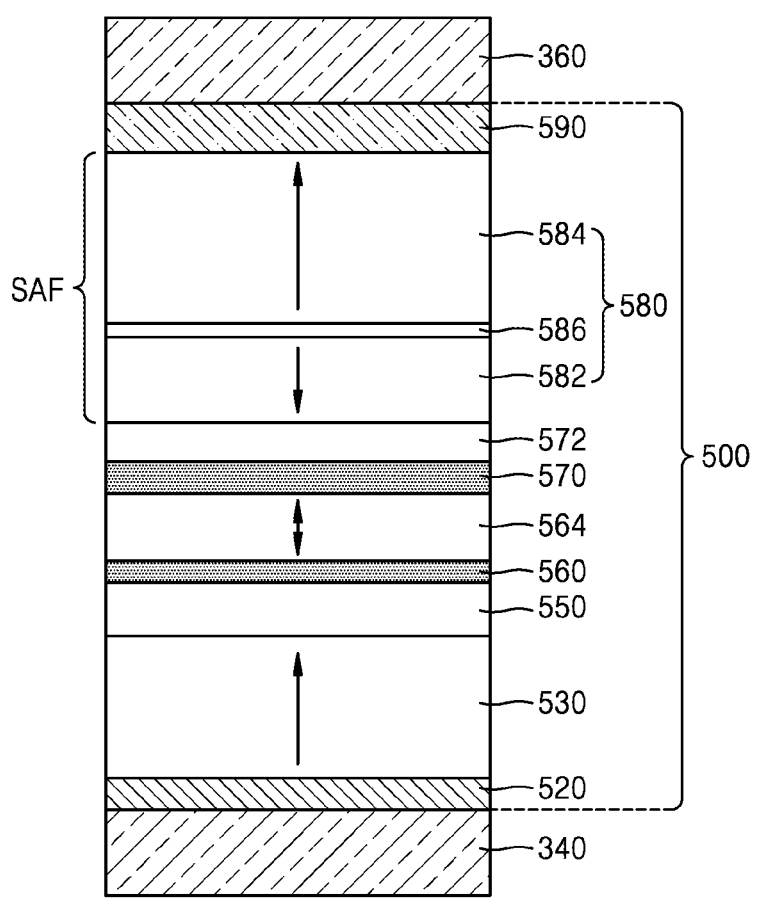

Referring to FIG. 7, a magnetic device according to an example embodiment may include a variable resistance structure 150C.

In at least some example embodiments, the variable resistance structures 150 of the magnetic device 100 illustrated in FIGS. 3A and 3B or the variable resistance structures 150 of the magnetic device 200 illustrated in FIG. 4 may be configured as the variable resistance structure 150C illustrated in FIG. 7.

The variable resistance structure 150C may include a magnetic resistance element 500 disposed between a lower electrode 340 and an upper electrode 360. The magnetic resistance element 500 may include a seed layer 520 formed on the lower electrode 340 and a lower fixed layer 530 formed on the seed layer 520.

The seed layer 520 may be formed of Ru, Pt, Pd, and/or the like.

In at least some example embodiments, a buffer layer (not shown) may be disposed between the lower electrode 340 and the seed layer 520. The buffer layer may match a crystal structure of the lower electrode 340 with a crystal structure of the seed layer 520, between the lower electrode 340 and the seed layer 520. For example, the buffer layer may be formed Ta and/or the like.

The lower fixed layer 530 may counteract a magnetic field leaking from an upper fixed layer 580 having the SAF structure to provide more stable switching characteristic. The lower fixed layer 530 may have a magnetization easy axis in a direction vertical to a surface contacting the seed layer 520. A magnetization direction is not changed in the lower fixed layer 530. In FIG. 7, it is illustrated that a magnetization direction of the lower fixed layer 530 is a direction (e.g., a direction toward the upper fixed layer 580) opposite to the lower electrode 340, but inventive concepts should not be limited to this example. The magnetization direction of the lower fixed layer 530 may be formed toward the lower electrode 340.

In at least some example embodiments, the lower fixed layer 530 may be a vertically fixed layer based on cobalt (Co). For example, the lower fixed layer 530 may have a [Co/Pt]×n (where n is the number of repetitions) stacked structure where a Co layer having a thickness of about 1 Å to about 5 Å and a Pt layer having a thickness of about 1 Å to about 5 Å are alternately stacked a plurality of times. In at least some other example embodiments, the lower fixed layer 530 may be a vertically fixed layer based on Co. For example, the lower fixed layer 530 may have a [Co/Pd]×n (where n is the number of repetitions) stacked structure where a Co layer having a thickness of about 1 Å to about 5 Å and a Pd layer having a thickness of about 1 Å to about 5 Å are alternately stacked a plurality of times.

The lower fixed layer 530 may be formed by an ultra-thin film epitaxial growth process based on solid phase epitaxy growth. For example, the lower fixed layer 530 may be formed by a molecular beam epitaxy (MBE) process or a metal organic chemical vapor deposition (MOCVD) process. The lower fixed layer 530 may be formed at a relatively low process temperature of about 200 t to about 400° C. For example, the lower fixed layer 530 may be formed at a temperature of about 300° C. The lower fixed layer 530 may have a thickness of about 20 Å to about 30 Å.

A first polarization enhancement layer 550 for enhancing spin polarization in the lower fixed layer 530 may be formed on the lower fixed layer 530. The first polarization enhancement layer 550 may be formed as a CoFeB magnetic layer. A magnetization direction of the first polarization enhancement layer 550 may be the same as that of the lower fixed layer 530. The first polarization enhancement layer 550 may have a thickness of about 10 Å to about 20 Å. In at least some example embodiments, the first polarization enhancement layer 550 may be omitted.

A first tunnel barrier 560 may be formed on the first polarization enhancement layer 550, and a free layer 564 having a variable magnetization direction may be formed on the first tunnel barrier 560. A second tunnel barrier 570 may be formed on the free layer 564, and an upper fixed layer 580 may be formed on the second tunnel barrier 570.

The first tunnel barrier 560 and the second tunnel barrier 570 may each include a nonmagnetic material. In at least some example embodiments, the first tunnel barrier 560 and the second tunnel barrier 570 may each be formed of a material selected from among Mg, Ti, Al, MgZn, MgB, and the like. In at least some other example embodiments, the first tunnel barrier 560 and the second tunnel barrier 570 may each be formed of Ti nitride or V nitride. In at least some example embodiments, at least one of the first tunnel barrier 560 and the second tunnel barrier 570 may be formed of a single layer. In at least some other example embodiments, at least one of the first tunnel barrier 560 and the second tunnel barrier 570 may be formed of a multilayer structure including a plurality of layers. For example, at least one of the first tunnel barrier 560 and the second tunnel barrier 570 may have a multilayer structure selected from among Mg/MgO, MgO/Mg, and Mg/MgO/Mg. In at least some example embodiments, a thickness of the second tunnel barrier 570 may be greater than a thickness of the first tunnel barrier 560.

The magnetic resistance element 500 included in the variable resistance structure 150C illustrated in FIG. 7 may provide a dual magnetic tunneling junction (MTJ) structure including the first tunnel barrier 560 and the second tunnel barrier 570. When a current is supplied through the dual MTJ structure including the first tunnel barrier 560 and the second tunnel barrier 570, the free layer 564 may switch between relatively stable magnetic states. Since the magnetic resistance element 500 has the dual MTJ structure, an enhanced performance of a more highly integrated magnetic device is provided.

In at least some example embodiments, the first tunnel barrier 560 may be omitted.

A second polarization enhancement layer 572 may be disposed between the second tunnel barrier 570 and the upper fixed layer 580. The second polarization enhancement layer 572 may include a ferromagnetic material selected from among Co, Fe, Ni, and the like. The second polarization enhancement layer 572 may have a relatively high spin polarization rate and a relatively low damping constant. To this end, the second polarization enhancement layer 572 may further include a nonmagnetic material selected from among B, Zn, Ru, Ag, Au, Cu, C, N, and the like. In at least some example embodiments, the second polarization enhancement layer 572 may be formed as a CoFeB magnetic layer. The second polarization enhancement layer 572 may have a thickness of about 10 Å to about 20 Å. In at least some example embodiments, the second polarization enhancement layer 572 may be omitted.

The upper fixed layer 580 may include a first upper fixed layer 582, a second upper fixed layer 584, and an exchange coupling layer 586 disposed there between. The first upper fixed layer 582 may have a magnetic moment, which is antiparallel to a magnetic moment of the lower fixed layer 530. The second upper fixed layer 584 may have a magnetic moment, which is antiparallel to a magnetic moment of the first upper fixed layer 582.

The upper fixed layer 580 may have the SAF structure, which is as described above on the perpendicular fixed layer PL with reference to FIG. 6. In this case, the first upper fixed layer 582 and the second upper fixed layer 584 may respectively correspond to two ferromagnetic layers FM1 and FM2. Also, the exchange coupling layer 586 may correspond to a relatively thin nonmagnetic layer NM inserted between the two ferromagnetic layers FM1 and FM2.

The second polarization enhancement layer 572 enhances spin polarization in the first upper fixed layer 582. A magnetization direction of the second polarization enhancement layer 572 may be the same as that of the first upper fixed layer 582.

The upper fixed layer 580 may be formed on a capping layer 590. The capping layer 590 may include at least one material selected from among Ru, Ta, Al, Cu, Au, Ag, Ti, TaN, TiN, combinations thereof, and the like.

In the magnetic resistance element 500 illustrated in FIG. 7, a resistance value of a magnetic device may be changed depending on directions of electrons flowing through the dual MTJ structure. Data may be stored in a memory cell including the magnetic device by using a difference between resistance values.

Figure 8:
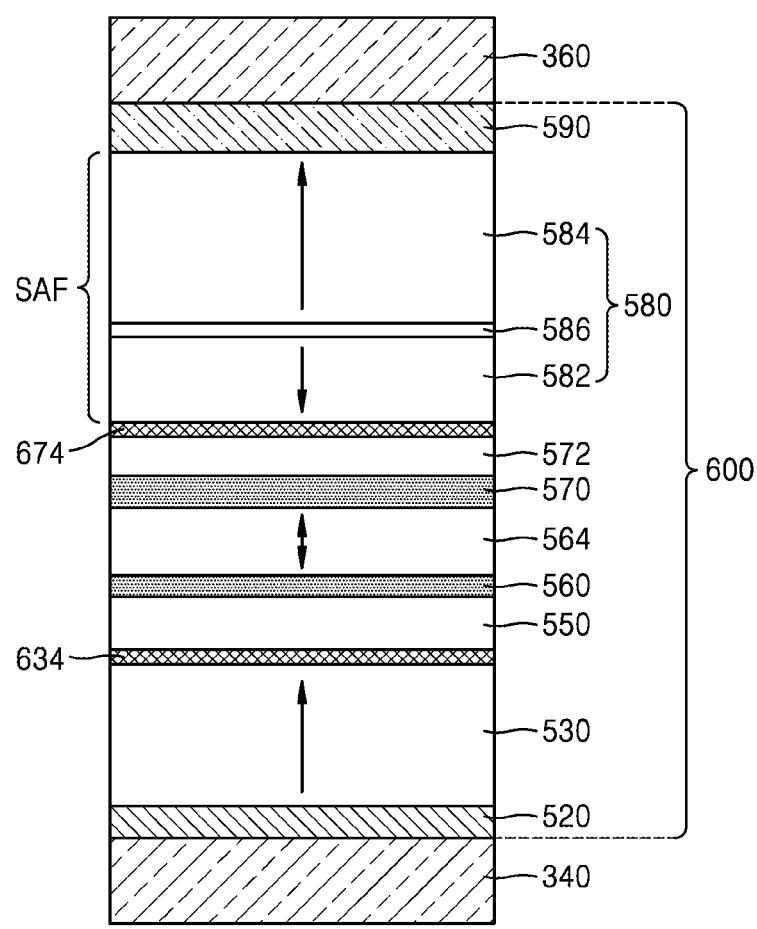

Referring to FIG. 8, a magnetic device according to example embodiments may include a variable resistance structure 150D.

In at least some example embodiments, the variable resistance structures 150 of the magnetic device 100 illustrated in FIGS. 3A and 3B or the variable resistance structures 150 of the magnetic device 200 illustrated in FIG. 4 may be configured as the variable resistance structure 150D illustrated in FIG. 8.

A magnetic resistance element 600 of the variable resistance structure 150D may be similar to the magnetic resistance element 500 of the variable resistance structure 150C illustrated in FIG. 7, except that the magnetic resistance element 600 of the variable resistance structure 150D may include a first amorphous layer 634 disposed between a lower fixed layer 530 and a first polarization enhancement layer 550 and a second amorphous layer 674 disposed between a second polarization enhancement layer 572 and a first upper fixed layer 582.

In at least some example embodiments, the first amorphous layer 634 and the second amorphous layer 674 may each be formed of Ta. In at least some example embodiments, the first amorphous layer 634 and the second amorphous layer 674 may each have a thickness of about 1 Å to about 6 Å, but inventive concepts should not be limited to this example.

Figure 9:
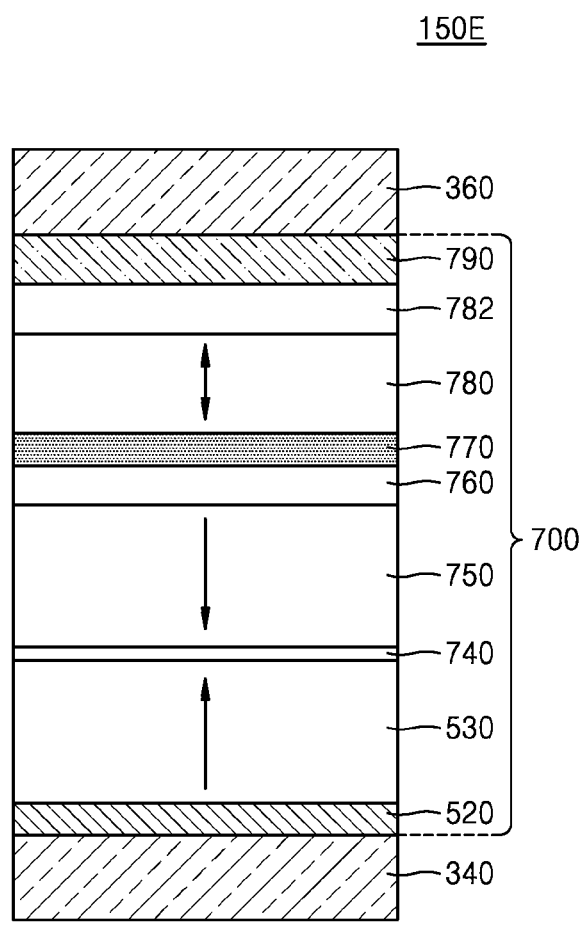

Referring to FIG. 9, a magnetic device according to example embodiments may include a variable resistance structure 150E.

In some example embodiments, the variable resistance structures 150 of the magnetic device 100 illustrated in FIGS. 3A and 3B or the variable resistance structures 150 of the magnetic device 200 illustrated in FIG. 4 may be configured as the variable resistance structure 150E illustrated in FIG. 9.

As described above with reference to FIG. 7, a magnetic resistance element 700 included in the variable resistance structure 150E may include a seed layer 520 formed on a lower electrode 340. A lower fixed layer 530 having perpendicular magnetic anisotropy may be formed on the seed layer 520. An exchange coupling layer 740 and an upper fixed layer 750 may be sequentially formed on the lower fixed layer 530. The upper fixed layer 750 may have a magnetic moment, which is antiparallel to a magnetic moment of the lower fixed layer 530. More detailed configurations of the exchange switching layer 740 and the upper fixed layer 750 are essentially the same as the configurations of the exchange coupling layer 586 and the second upper fixed layer 584 described above with reference to FIG. 7. Thus, a more detailed discussion is omitted.

A polarization enhancement layer 760, a tunnel barrier 770, and a free layer 780, a nano-oxide layer (NOL) 782, and a capping layer 790 may be sequentially formed on the upper fixed layer 750.

The polarization enhancement layer 760 may be formed as a CoFeB magnetic layer. The tunnel barrier 770 may include a nonmagnetic material. The tunnel barrier 770 may have essentially the same configuration as that of the second tunnel barrier 570 described above with reference to FIG. 7, and thus, a more detailed discussion is omitted.

The NOL 782 may be formed of Ta oxide, Mg oxide, or the like. In at least some example embodiments, the NOL 782 may be omitted.

A detailed configuration of the capping layer 790 may be essentially the same as that of the capping layer 590 described above with reference to FIG. 7. Thus, a more detailed discussion is omitted.

FIGS. 10A to 10I are cross-sectional views illustrating a method of manufacturing a magnetic device according to an example embodiment. In the example embodiment shown in FIGS. 10A to 10I, a method of manufacturing the magnetic device 100 illustrated in FIGS. 3A and 3B will be described as an example. In FIGS. 10A to 10I, reference numerals that are the same as reference numerals illustrated in FIGS. 1 and 9 refer to like elements, and their detailed descriptions are not repeated.

Figure 10A:
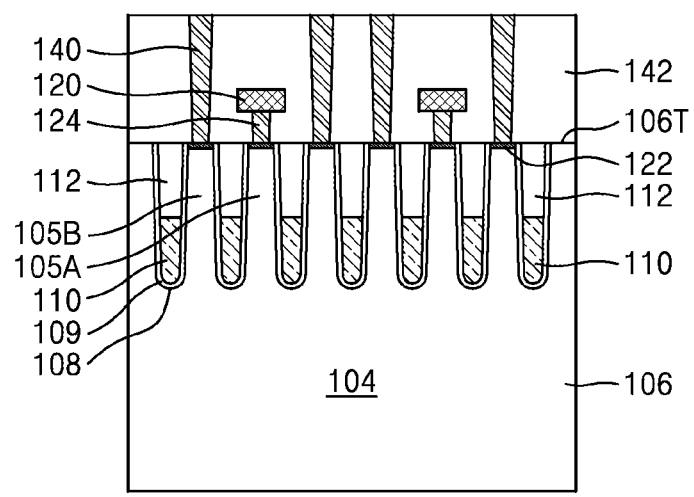
FIGS. 10A to 10L are cross-sectional views illustrating a method of manufacturing a magnetic device according to an example embodiment.
Figure 10A:
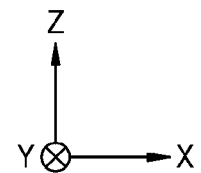

Referring to FIG. 10A, a plurality of active areas 104 may be defined by forming a device isolation layer (not shown) on a substrate 106, and then, a plurality of gate trenches 108 may be formed on the substrate 106. The plurality of gate trenches 108 may extend in parallel along a Y-axis direction and may each have a line shape intersecting the plurality of active areas 104.

A plurality of gate dielectric layers 109, a plurality of word lines 110, and a plurality of buried insulation layers 112 may be sequentially formed in the plurality of gate trenches 108.

In at least some example embodiments, the plurality of word lines 110 may be formed, and then, by injecting impurity ions into the active areas 104 of the substrate 106 from both sides of each of the word lines 110, a plurality of first source/drain regions 105A and a plurality of second source/drain regions 105B may be formed on a top of each of the active areas. In at least some other example embodiments, an impurity ion injection process of forming the plurality of first source/drain regions 105A and the plurality of second source/drain regions 105B may be performed before forming the plurality of word lines 110. A metal silicide layer 122 may be formed on a top of each of the first source/drain regions 105A and the second source/drain regions 105B.

The plurality of word lines 110 may be formed on a level lower than a top 106T of the substrate 106. In at least some example embodiments, the plurality of word lines may each be formed of at least one material selected from among Ti, TiN, Ta, TaN, W, WN, TiSiN, WSiN, combinations thereof, or the like. However, inventive concepts should be limited to these examples.

The gate dielectric layer 109 may be formed of at least one material selected from among silicon oxide, silicon nitride, silicon oxynitride, oxide/nitride/oxide (ONO), a high-k dielectric film having a dielectric constant higher than that of silicon oxide, etc. For example, the gate dielectric layer 109 may have a dielectric constant of about 10 to about 25. In at least some example embodiments, the gate dielectric layer 109 may be formed of at least one material selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and the like. For example, the gate dielectric layer 109 may be formed of $HfO_2$, $Al_2O_3$, $HfAlO_3$, $Ta_2O_3$, $TiO_2$, combinations thereof, or the like.

The buried insulation layer 112 may be formed of silicon oxide, silicon nitride, silicon oxynitride, a combination thereof, or the like.

A structure, which includes a source line contact plug 124, a plurality of source lines 120, a plurality of buried contact plugs 140, and a first interlayer insulation layer 142 for insulating these, may be formed on an end material where the buried insulation layer 112 is formed.

Figure 10B:
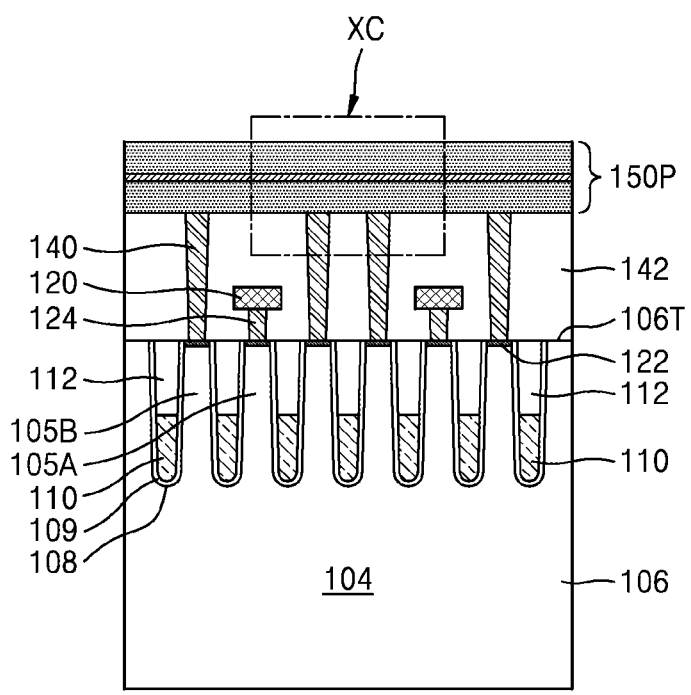
Figure 10B:
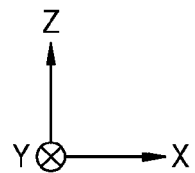

Referring to FIG. 10B, an auxiliary variable resistance structure layer 150P may be formed on the first interlayer insulation layer 142. The auxiliary variable resistance structure layer 150P may include a magnetic material-stacked structure and a conductive layer for electrode formation.

Figure 10C:
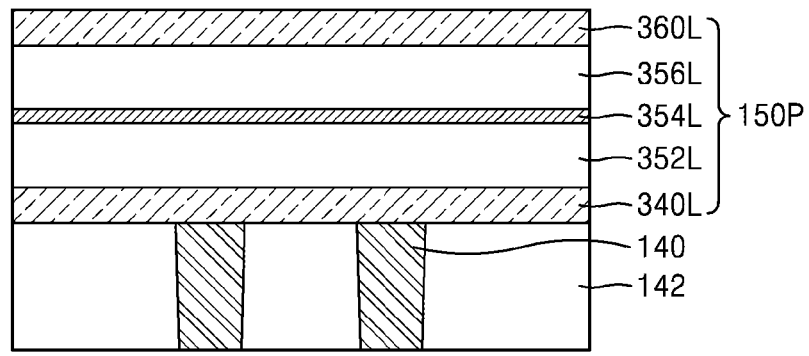
Figure 10C:
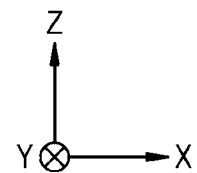

FIG. 10C is an enlarged cross-sectional view of a region XC illustrated in FIG. 10B. An example configuration of the auxiliary variable resistance structure layer 150P illustrated in FIG. 10B will be described in more detail with reference to FIG. 10C.

Referring to FIG. 10C, the auxiliary variable resistance structure layer 150P may include a lower electrode layer 340L, an auxiliary first magnetization layer 352L, a tunnel barrier layer 354L, an auxiliary second magnetization layer 356L, and an upper electrode layer 360L, which are sequentially stacked on the plurality of buried contact plugs 140 and the first interlayer insulation layer 142.

The details of each of the lower electrode 340, the first magnetization layer 352, the tunnel barrier 354, the second magnetization layer 356, and the upper electrode 360 described above with reference to FIG. 5A may be applied to the lower electrode layer 340L, the auxiliary first magnetization layer 352L, the tunnel barrier layer 354L, the auxiliary second magnetization layer 356L, and the upper electrode layer 360L.

Figure 10D:
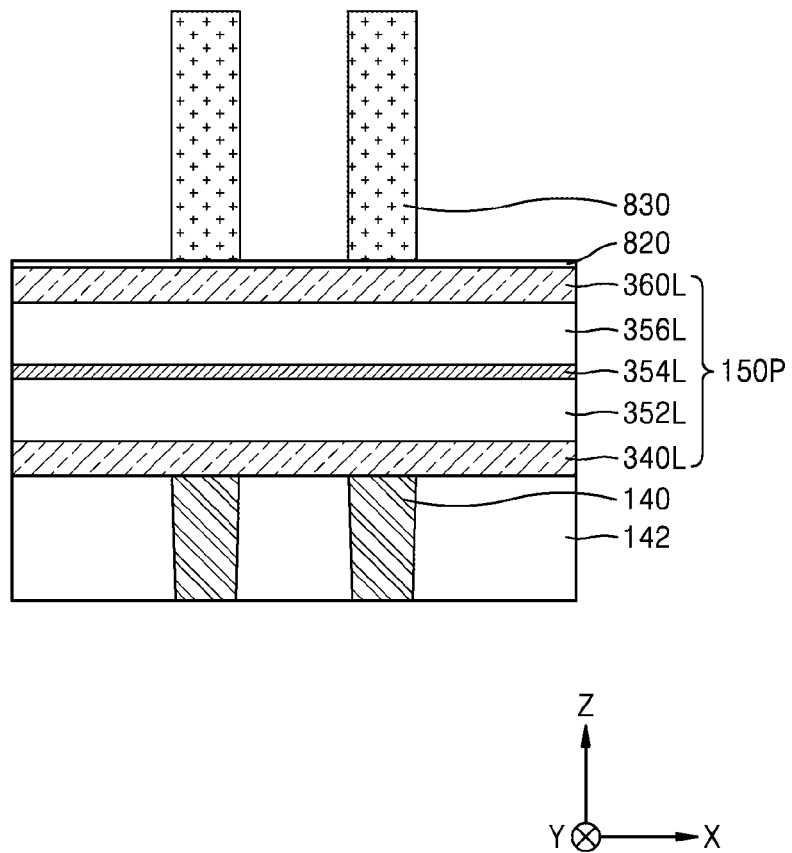

Referring to FIG. 10D, an anti-oxidation layer 820 may be formed on the auxiliary variable resistance structure layer 150P, and a plurality of sacrificial mask patterns 830 may be formed on the anti-oxidation layer 820. As discussed herein, the plurality of sacrificial mask patterns may also be referred to as portions of a sacrificial mask pattern.

The anti-oxidation layer 820 may suppress and/or prevent the upper electrode layer 360L from being oxidized. The anti-oxidation layer 820 may be formed of nitride and/or the like, but should not be limited to these examples. In at least some example embodiments, the anti-oxidation layer 820 may be formed to a thickness (e.g., minimum thickness) sufficient to suppress and/or prevent the upper electrode layer 360L from being oxidized. In at least some example embodiments, the anti-oxidation layer 820 may be omitted. In this case, the plurality of sacrificial mask patterns 830 may be formed just on the upper electrode layer 360L.

The plurality of sacrificial mask patterns 830 may each be formed of materials forming the auxiliary variable resistance structure layer 150P and a material having an etch selectivity. In at least some example embodiments, the upper electrode layer 360L may include metal, and the plurality of sacrificial mask patterns 830 may not include metal. In at least some example embodiments, the plurality of sacrificial mask patterns 830 may each be formed of a polysilicon layer, nitride layer, a carbon-containing layer, or the like. The carbon-containing layer may be formed of an amorphous carbon layer (ACL), a hydrocarbon compound which has a relatively high-content carbon of about 85 wt % to about 99 wt % with respect to a total weight, or a layer (hereinafter referred to as a spin on hard mask (SOH) layer) formed of derivatives of the hydrocarbon compound.

The plurality of sacrificial mask patterns 830 may be used as an etch mask for etching the auxiliary variable resistance structure layer 150P in a subsequent etching process, which will be described below with reference to FIG. 10E. The plurality of sacrificial mask patterns 830 may be formed to have a thickness greater than that of the upper electrode layer 360L.

Figure 10E:
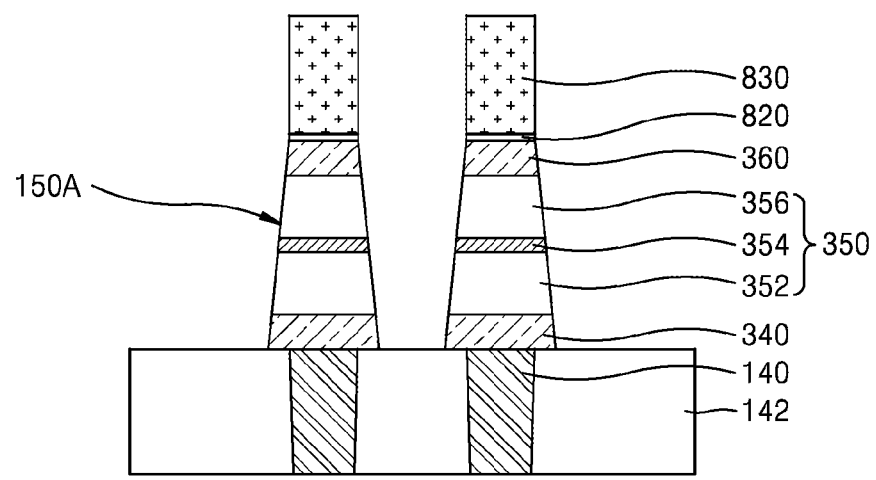

Referring to FIG. 10E, a plurality of variable resistance structures 150A may be formed by etching the anti-oxidation layer 820 and the auxiliary variable resistance structure layer 150P (see FIG. 10D) with the sacrificial mask patterns 830 as an etch mask. The plurality of variable resistance structures 150A may each include a lower electrode 340, an upper electrode 360, and a magnetic resistance element 350 disposed between the lower electrode 340 and the upper electrode 360. The magnetic resistance element 350 may include a tunnel barrier 354, a first magnetization layer 352 disposed on one side of the tunnel barrier 354, and a second magnetization layer 356 disposed on the other side of the tunnel barrier 354.

In at least some example embodiments, a plasma etching process may be performed for etching the auxiliary variable resistance structure layer 150P. In at least some example embodiments, an ion beam etching (IBE) process, a reactive ion etching (RIE) process, an Ar milling process, etc., may be performed for etching the auxiliary variable resistance structure layer 150P. In at least some example embodiments, $SF_6$, $NF_3$, $SiF_4$, $CF_4$, $Cl_2$, $CH_3OH$, $CH_4$, $CO$, $NH_3$, $H_2$, $N_2$, HBr, a first etching gas including a combination thereof, or the like, may be used for etching the auxiliary variable resistance structure layer 150P. In other example embodiments, in addition to the first etching gas, at least one first additional gas selected from among Ne, Ar, Kr, Xe, etc., may be further used to etch the auxiliary variable resistance structure layer 150P.

An etching process performed for the auxiliary variable resistance structure layer 150P may be performed by using plasma generated from an inductively coupled plasma (ICP) source, a capacitively coupled plasma (CCP) source, an electron cyclotron resonance (ECR) plasma source, a helicon-wave excited plasma (HWEP) source, an adaptively coupled plasma (ACP) source, or the like.

The etching process performed for the auxiliary variable resistance structure layer 150P may further include an etching process using a second etching gas having a composition different from that of the first etching gas. The second etching gas may include $SF_6$, $NF_3$, $SiF_4$, $CF_4$, $Cl_2$, $CH_3OH$, $CH_4$, $CO$, $NH_3$, $H_2$, $N_2$, HBr, a combination thereof, or the like. In other example embodiments, at least one second additional gas selected from among Ne, Ar, Kr, Xe, etc., may be further used for the etching process using the second etching gas.

The etching process performed for the auxiliary variable resistance structure layer 150P may be performed at a temperature of about −10° C. or about 65° C. and a pressure of about 2 mT to about 5 mT. While the etching process for the auxiliary variable resistance structure layer 150P is being performed, some of the sacrificial mask patterns 830 may be consumed by an etching atmosphere, and thus, may have a reduced thickness.

Although not shown, the plurality of variable resistance structures 150A may be obtained, and then, the first interlayer insulation layer 142 exposed to an etching atmosphere of the auxiliary variable resistance structure layer 150P may be consumed by a certain thickness from a top thereof.

Figure 10F:
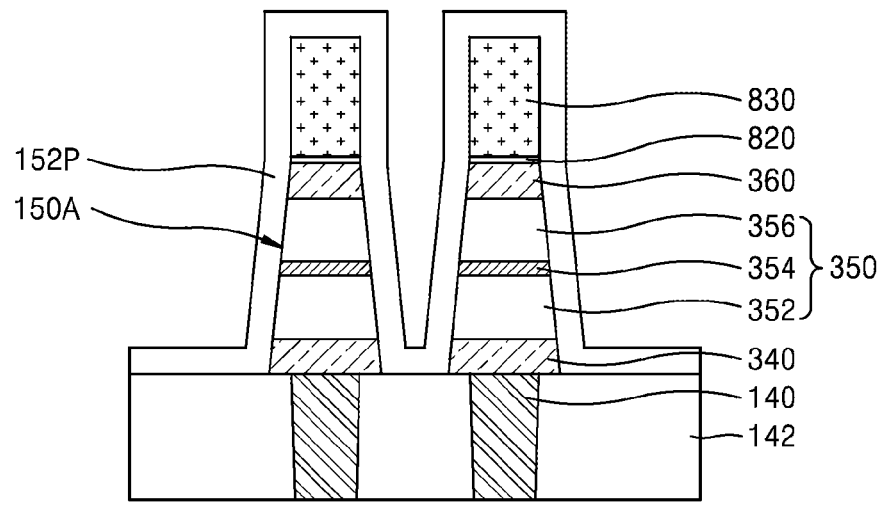

Referring to FIG. 10F, the plurality of variable resistance structures 150A may be formed, and then an auxiliary insulation spacer 152P, which covers the plurality of variable resistance structures 150A, the anti-oxidation layer 820, and the plurality of sacrificial mask patterns 830, may be formed on the first interlayer insulation layer 142 in a state where the plurality of sacrificial mask patterns 830 remain on the plurality of variable resistance structures 150A.

When the plurality of variable resistance structures 150A are exposed to air, the auxiliary insulation spacer 152P may suppress and/or prevent a magnetic characteristic (for example, TMR characteristic, switching field $H_c$ distribution characteristic, saturation magnetization $M_s$ characteristic in a free layer, etc.) of the variable resistance structures 150A from being deteriorated. Also, the auxiliary insulation spacer 152P may secure a process margin corresponding to a thickness of the variable resistance structures 150A.

The auxiliary insulation spacer 152P may be formed of a material having an etch selectivity with respect to the plurality of sacrificial mask patterns 830 and an auxiliary second interlayer insulation layer 162P described above with reference to FIG. 10G. The auxiliary insulation spacer 152P may be formed of a nonmagnetic insulator. In at least some example embodiments, the auxiliary insulation spacer 152P may be formed of aluminum oxide, silicon oxide, silicon nitride, silicon oxynitride, a high-k dielectric film whose a dielectric constant is at least 8, a combination thereof, or the like. In at least some example embodiments, the high-k dielectric film may be formed of HfO, ZrO, or the like, but a material of the auxiliary insulation spacer 152P should not be limited to these examples.

The auxiliary insulation spacer 152P may be formed to have a thickness of about 10 Å to about 50 Å, but inventive concepts should not be limited to this example.

A chemical vapor deposition (CVD) process, a physical vapor deposition (PVD) process, an oxidation process, a combination thereof, or the like, may be used for forming the auxiliary insulation spacer 152P, but a process of forming the auxiliary insulation spacer 152P should not be limited to these examples.

Figure 10G:
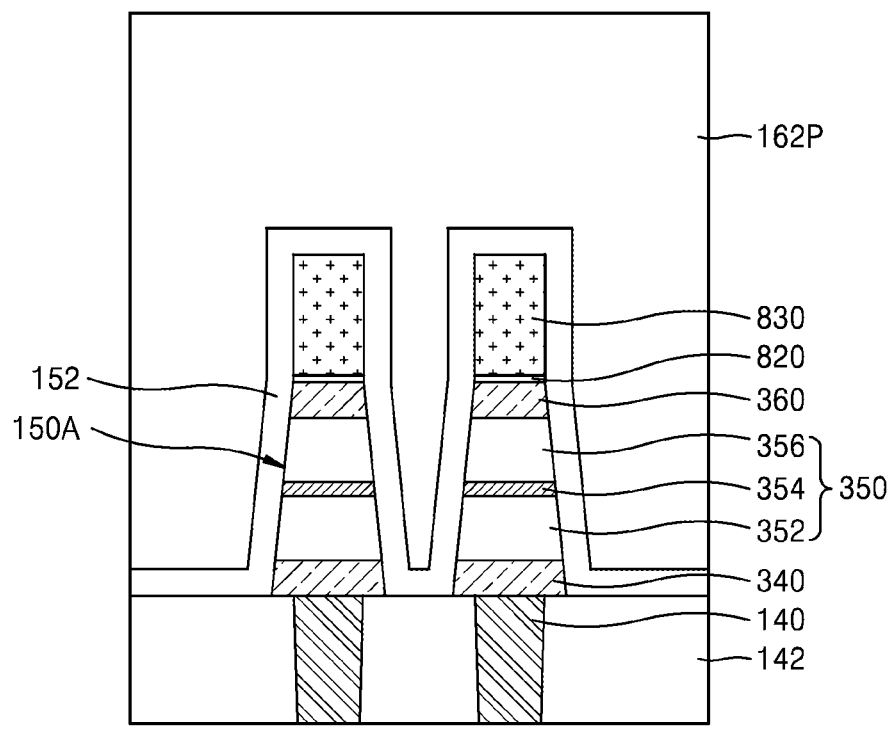

Referring to FIG. 10G, an auxiliary second interlayer insulation layer 162P may be formed on the plurality of variable resistance structures 150A covered by the auxiliary insulation spacer 152P.

The auxiliary second interlayer insulation layer 162P may be formed to a thickness sufficient to have a level higher than a top of the auxiliary insulation spacer 152P.

The auxiliary second interlayer insulation layer 162P may be formed of oxide, nitride, a combination thereof, or the like, but should not be limited thereto.

Figure 10H:
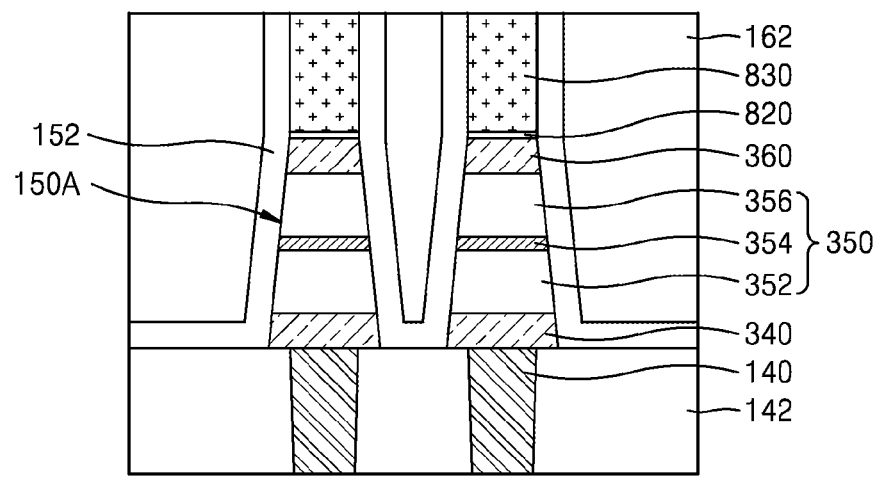

Referring to FIG. 10H, a second interlayer insulation layer 162 having an planarized or substantially planarized top and an insulation spacer 152 including an open region, which is formed in a partial region of an upper portion of the insulation spacer 152, may be formed by removing a portion of each of the auxiliary second interlayer insulation layer 162P and the auxiliary insulation spacer 152P (see FIG.

10G) from tops thereof. Tops of the sacrificial mask patterns 830 may be exposed through the open region of the insulation spacer 152.

In at least some example embodiments, a chemical mechanical polishing (CMP) process may be used for removing a portion of each of the auxiliary second interlayer insulation layer 162P and the auxiliary variable resistance structure layer 150P (see FIG. 10G) from tops thereof, but inventive concepts should not be limited thereto.

Figure 10I:
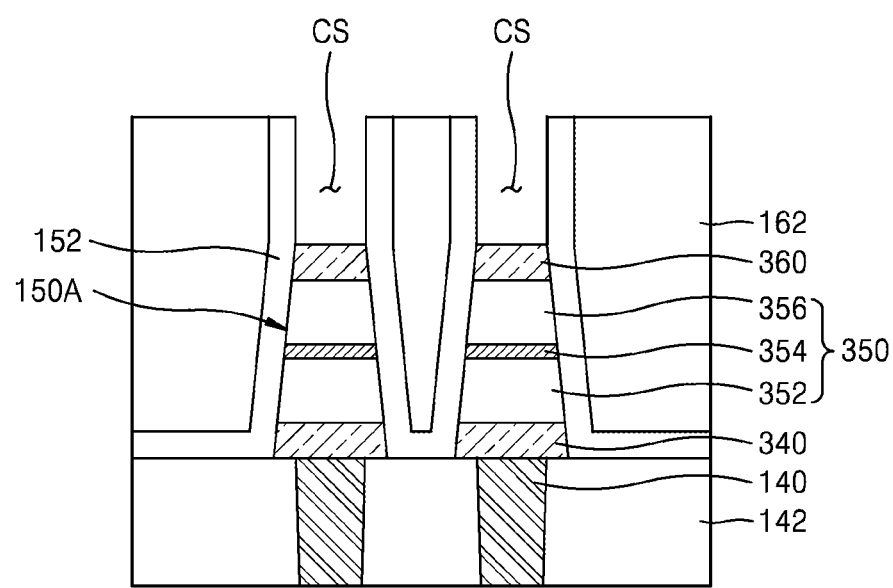

Referring to FIG. 10I, by selectively removing the anti-oxidation layer 820 and the sacrificial mask patterns 830 exposed through the open region of the insulation spacer 152 from a result of FIG. 10H, a plurality of contact spaces CS limited by the insulation spacer 152 may be provided, and a plurality of upper electrodes 360 may be exposed through the plurality of contact spaces CS.

An etch selectivity difference between the second interlayer insulation layer 162 and the sacrificial mask patterns 830 and an etch selectivity difference between the insulation spacer 152 and the sacrificial mask patterns 830 may be used for removing the sacrificial mask patterns 830.

In at least some example embodiments, the plurality of sacrificial mask patterns 830 may each include a carbon-containing layer such as an ACL layer or an SOH layer. In this case, an ashing and strip process using oxygen ($O_2$) plasma may be used for removing the plurality of sacrificial mask patterns 830. In at least some other example embodiments, the plurality of sacrificial mask patterns 830 may each be formed of polysilicon or the like, and the insulation spacer 152 and the second interlayer insulation layer 162 may each be formed of oxide, nitride, or the like. In this case, a dry etching process using an etch selectivity difference between oxide and nitride may be used for removing the plurality of sacrificial mask patterns 830. In at least some other example embodiments, the plurality of sacrificial mask patterns 830 may each be formed of nitride, and the insulation spacer 152 and the second interlayer insulation layer 162 may each be formed of oxide. In this case, a wet etching process using an etch selectivity difference between oxide and nitride may be used for removing the plurality of sacrificial mask patterns 830.

In at least some example embodiments, over-etching may be performed while dry etching or wet etching is being performed for removing the plurality of sacrificial mask patterns 830, for removing the anti-oxidation layer 820. In at least some example embodiments, a separate etching process may be performed for removing the anti-oxidation layer 820. The anti-oxidation layer 820 may be formed to a relatively thin (e.g., very thin) thickness, and thus, peripheral layers may not be affected while the anti-oxidation layer 820 is being removed.

If forming of the anti-oxidation layer 820 is omitted in the process described above with reference to FIG. 10D, then the plurality of upper electrodes 360 may be exposed through the plurality of contact spaces CS by removing the plurality of sacrificial mask patterns 830.

As described above with reference to FIG. 10I, since the plurality of contact spaces CS are provided by removing the plurality of sacrificial mask patterns 830, the upper electrodes 360 may be suppressed and/or prevented from being consumed by an etch atmosphere while the plurality of contact spaces CS are being formed on the upper electrodes 360. Therefore, even in a case of forming MTJ cells having a relatively fine size necessary for implementation of a more highly integrated magnetic device, the upper electrodes 360 may be formed to a minimum thickness necessary for relatively high integration. Also, even when the upper electrodes 360 are formed to the minimum thickness, each of the upper electrodes 360 may be more stably connected to a wiring structure formed in a corresponding contact spacer CS in a subsequent process.

Figure 10J:
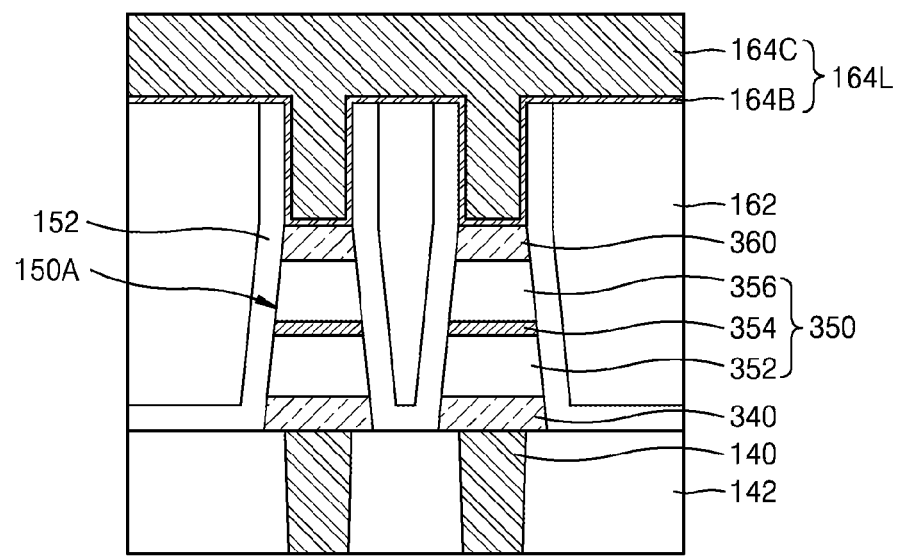

Referring to FIG. 10J, a conductive layer 164L connected to the plurality of upper electrodes 360 may be formed through the plurality of contact spaces CS (see FIG. 10I).

The conductive layer 164L may include a structure where a conductive barrier layer 164B and a metal layer 164C are sequentially stacked.

In at least some example embodiments, the conductive barrier layer 164B may be conformally formed in the plurality of contact spacers CS (see FIG. 10I) and on the second interlayer insulation layer 162 so as to form the conductive layer 164L. The metal layer 164C having a thickness sufficient to fill the plurality of contact spaces CS may then be formed on the conductive barrier layer 164B.

In at least some example embodiments, the conductive barrier layer 164B may include at least one material selected from among Ti, TiN, Ta, TaN, or the like. In at least some example embodiments, the PVD process may be used for forming the conductive barrier layer 164B.

In at least some example embodiments, the metal layer 164C may be formed of at least one of metal, a conductive metal compound, a metal-semiconductor compound, a doped semiconductor, or the like. For example, the metal layer 16C may include Cu. In this case, in order to form the metal layer 164C, a Cu seed layer may be formed on a surface of the conductive barrier layer 164B, and then a Cu layer may grow from the Cu seed layer through an electroplating process, and a process of annealing an end material where the Cu layer is formed may be performed.

Figure 10K:
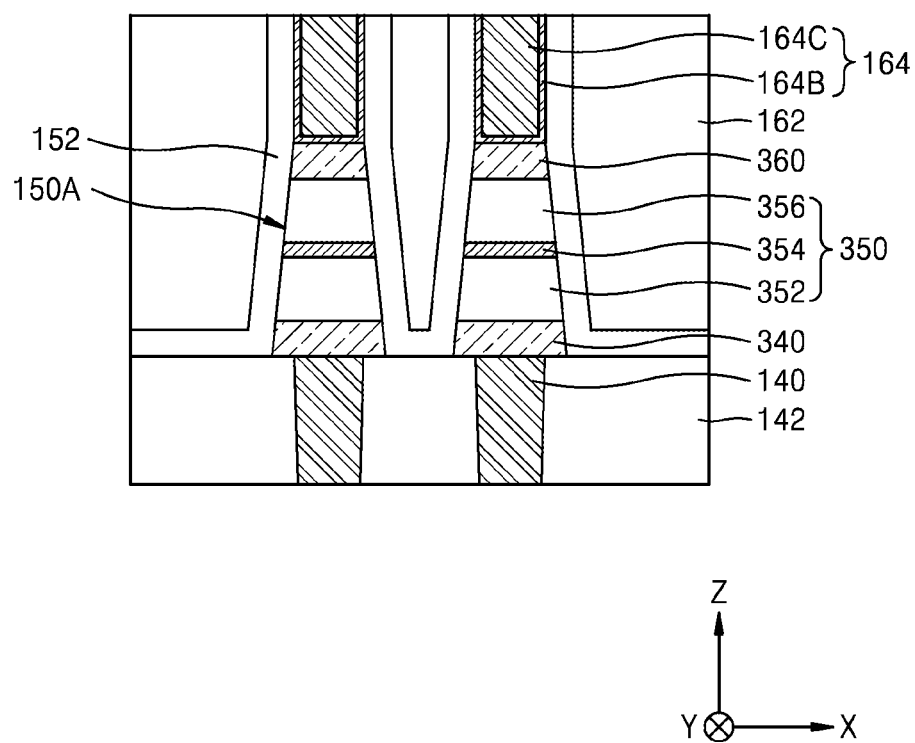

Referring to FIG. 10K, a top of the insulation spacer 152 and a top of the first interlayer insulation layer 162 may be exposed by polishing through the CMP process an end material where the conductive layer 164L (see FIG. 10J), and a plurality of contact plugs 164, which include the conductive barrier layer 164B and the metal layer 164C remaining in the plurality of contact spaces CS (see FIG. 10I), may be formed.

Figure 10L:
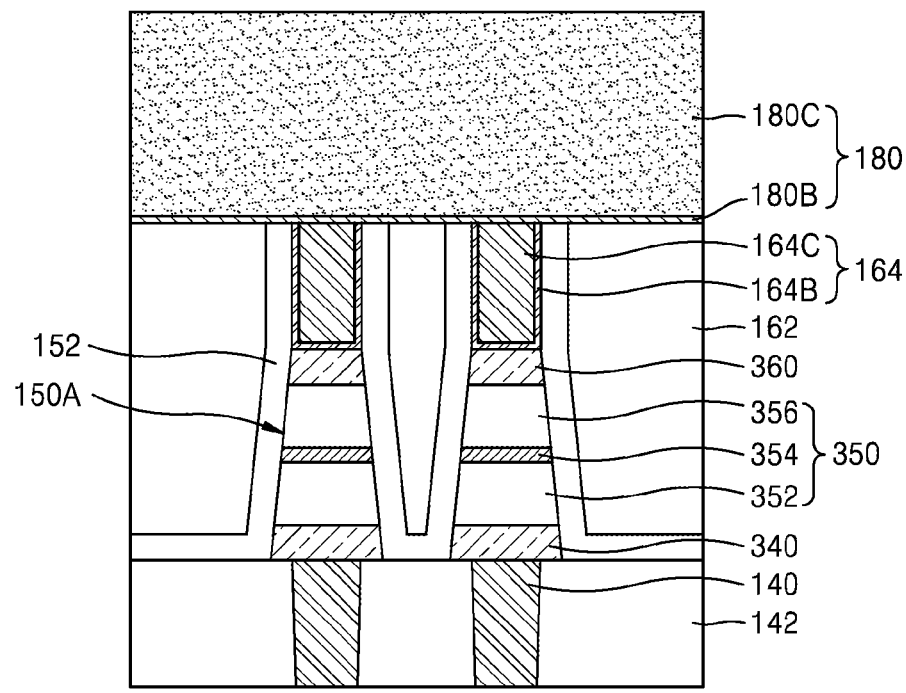

Referring to FIG. 10L, a plurality of bit lines 180 which extend in parallel or substantially parallel in a first direction (an X direction) on the plurality of contact plugs 164 and the second interlayer insulation layer 162 may be formed.

Each of the bit lines 180 may include a conductive barrier layer 180B, formed of Ti, TiN, Ta, TaN, a combination thereof, or the like, and a conductive line 180C formed on the conductive barrier layer 180B. In at least some example embodiments, the conductive line 180C may be formed as a Cu layer. In this case, a damascene process may be used for forming the plurality of bit lines 180. In at least some example embodiments, a process similar or substantially similar to the process of forming the contact plugs 164 described above with reference to FIGS. 10J and 10K may be performed for forming the plurality of bit lines 180.

Figure 11A:
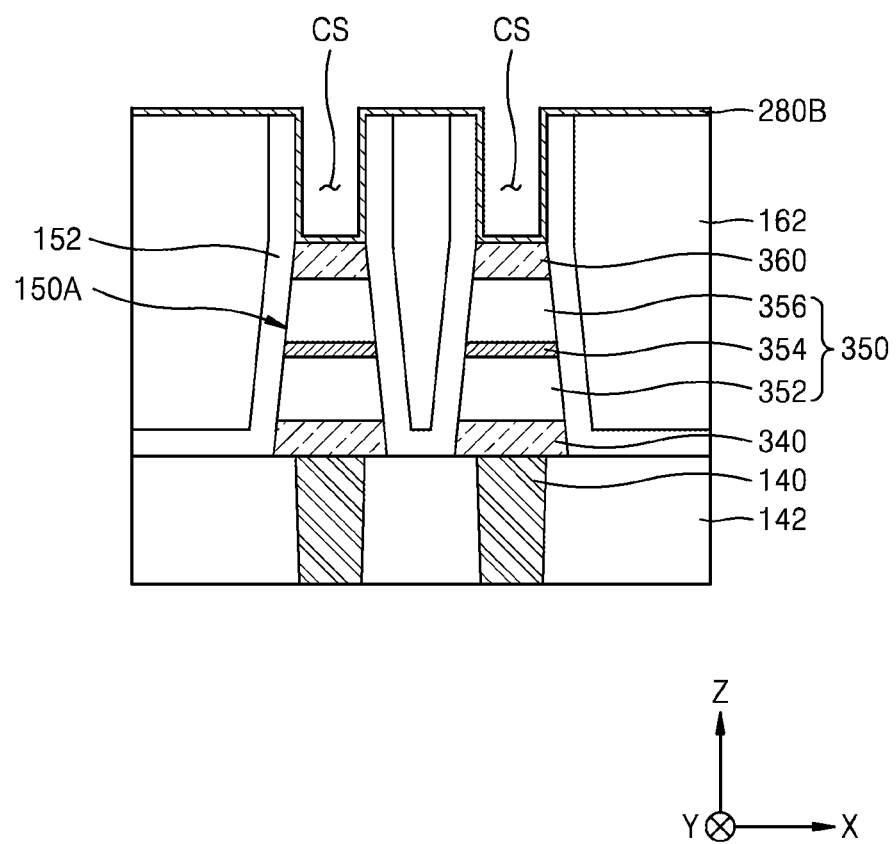
FIGS. 11A and 11B are cross-sectional views a method of manufacturing a magnetic device according to another example embodiment.
Figure 11B:
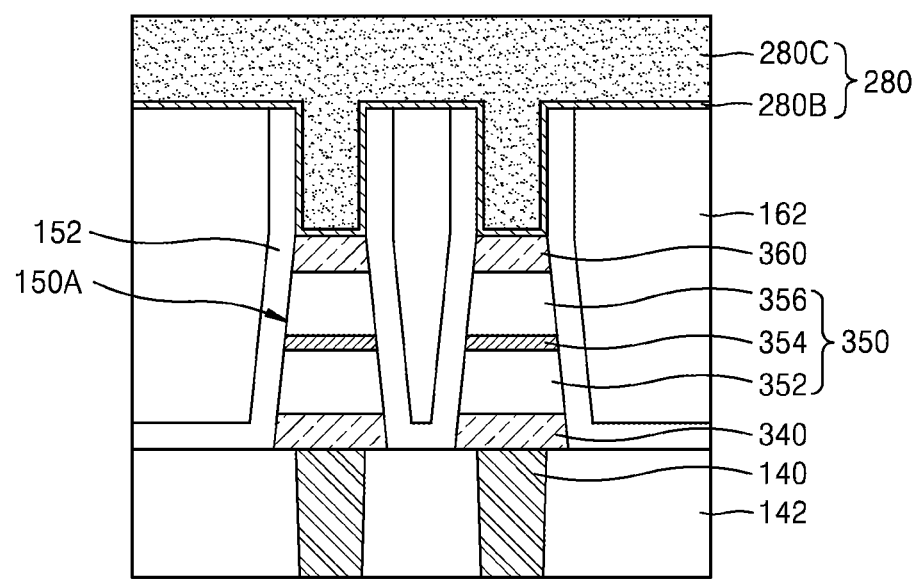

FIGS. 11A and 11B are cross-sectional views illustrating a method of manufacturing a magnetic device according to another example embodiment. A method of manufacturing a magnetic device having a structure similar to that of the magnetic device 200 illustrated in FIG. 4 will be described below with reference to FIGS. 11A and 11B. In FIGS. 11A and 11B, reference numerals that are the same as reference numerals illustrated in FIGS. 1 to 10I refer to like elements, and thus, their detailed descriptions are not repeated.

Referring to FIG. 11A, by using the method described above with reference to FIGS. 10A to 10I, a series of processes including a process of removing a plurality of sacrificial mask patterns 830 may be performed to provide a plurality of contact spaces CS exposing a plurality of upper electrodes 360. A conductive barrier layer 280B, which conformally covers inner walls of the contact spaces CS, a top of an insulation spacer 152, and a top of a second interlayer insulation layer 162, may then be formed.

In at least some example embodiments, the conductive barrier layer 280B may include at least one material selected from among Ti, TiN, Ta, TaN, or the like. In some example embodiments, the PVD process may be used for forming the conductive barrier layer 280B.

Referring to FIG. 11B, a plurality of bit line conductive lines 280C, which are filled into the plurality of contact spacers CS and extend in parallel or substantially parallel in a first direction (an X direction) on the second interlayer insulation layer 162, may be formed on the conductive barrier layer 280B.

In at least some example embodiments, the plurality of bit line conductive lines 280C may each include Cu. In this case, the damascene process may be used for forming the plurality of bit line conductive lines 280C.

The conductive barrier layer 280B and each of the bit line conductive lines 280C may configure a bit line 280. Portions of the bit line 280 filling the contact spaces CS may correspond to the plurality of lower protrusion bit line parts 284 described above with reference to FIG. 4, and a portion of the bit line 280 having a level higher than a top of the second interlayer insulation layer 162 may correspond to the upper bit line part 282 described above with reference to FIG. 4.

In the methods of manufacturing magnetic devices according to example embodiments described above with reference to FIGS. 10A to 11B, as illustrated in FIG. 10D, a plurality of sacrificial mask patterns 830 may be formed on an upper electrode layer 360L, and then an etching process of forming a plurality of variable resistance structures 150A (see FIG. 10E) may be performed by using the plurality of sacrificial mask patterns 830 as an etch mask. An insulation spacer 152 (see FIG. 10H), which covers side walls of the plurality of sacrificial mask patterns 830 and the plurality of variable resistance structures 150A, may be formed, and then a plurality of contact spaces CS (see FIG. 10I) surrounded by the insulation spacer 152 may be provided on the plurality of upper electrodes 360 by removing the plurality of sacrificial mask patterns 830. The plurality of sacrificial mask patterns 830 may be removed by using an etch selectivity difference with peripheral layers while the plurality of contact spaces CS are being formed on the plurality of upper electrodes 360, thereby suppressing and/or preventing the upper electrodes 360 from being consumed by an etch atmosphere. Also, even in a case of forming MTJ cells having a relatively fine size necessary for implementation of a more highly integrated magnetic device, the upper electrodes 360 may be formed to a minimum thickness necessary for relatively high integration. Also, even when the upper electrodes 360 are formed to the minimum thickness, each of the upper electrodes 360 may be more stably connected to a wiring structure formed in a corresponding contact spacer CS in a subsequent process.

Hereinabove, methods of manufacturing magnetic devices 100 including variable resistance structures 150A and magnetic devices 200 have been described with reference to FIGS. 10A to 11B. However, it should be understood by one of ordinary skill in the art that magnetic devices including the variable resistance structures 150B to 150E illustrated in FIGS. 6 to 9 may also be manufactured using one or more of the methods shown in FIGS. 10A to 11B within the scope of inventive concepts. Additionally, it should be understood that methods of manufacturing according to example embodiments may also be used to manufacture magnetic devices including variously modified and changed structures within the scope of inventive concepts.

Figure 12:
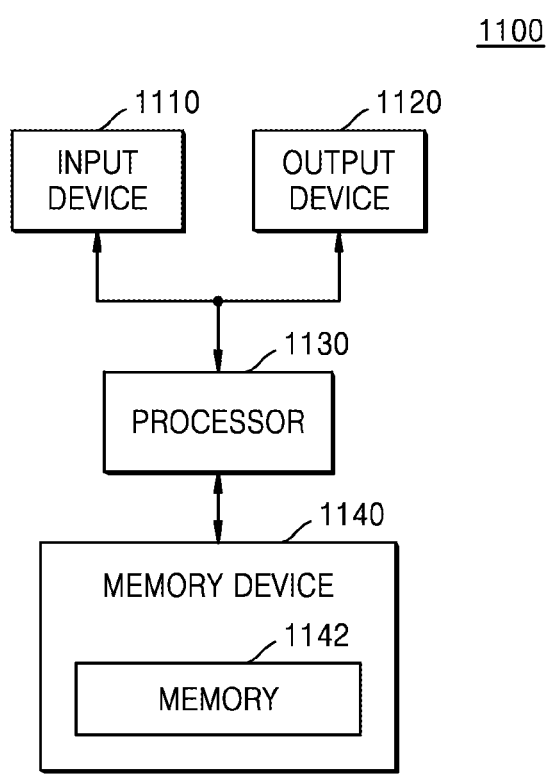
FIG. 12 is a block diagram of an electronic system including a magnetic device according to one or more example embodiments.

FIG. 12 is a block diagram of an electronic system 1100 including a magnetic device according to an example embodiment.

Referring to FIG. 12, the electronic system 1100 may include an input device 1110, an output device 1120, a processor 1130, and a memory device 1140. In at least some example embodiments, the memory device 1140 may include a cell array including a nonvolatile memory cell and a peripheral circuit for performing a read/write operation. In other example embodiments, the memory device 1140 may include a nonvolatile memory device and a memory controller.

A memory 1142 included in the memory device 1140 may include the magnetic device according to the example embodiments described above with reference to FIGS. 1 to 9.

The processor 1130 may be connected to the input device 1110, the output device 1120, and the memory device 1140 through an interface and may control an overall operation.

Figure 13:
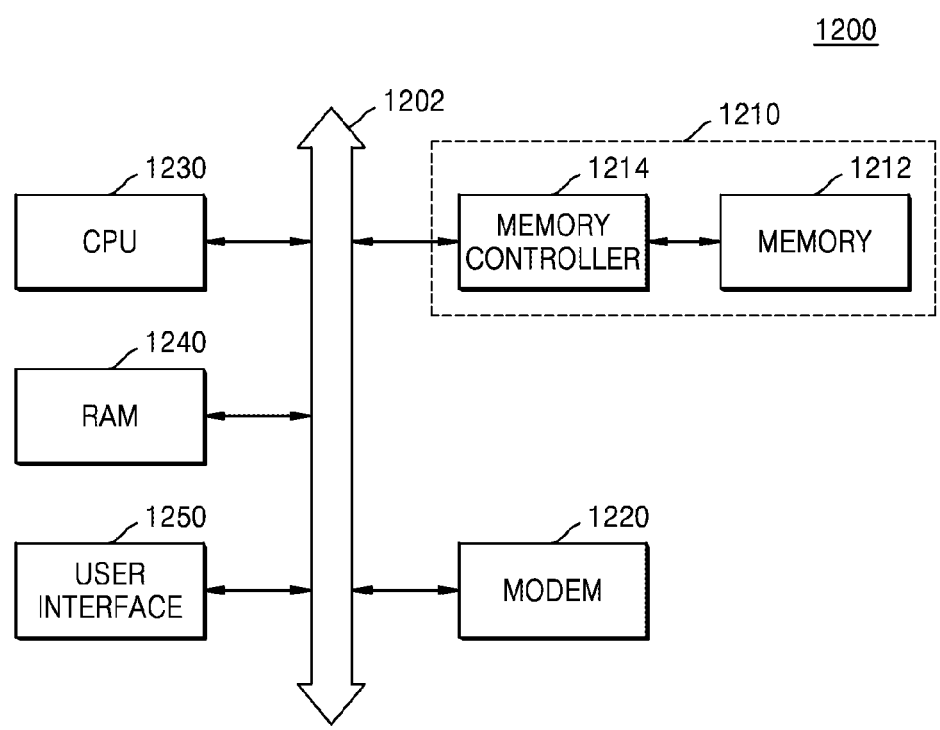
FIG. 13 is a block diagram of an information processing system including a magnetic device according to one or more example embodiments.

FIG. 13 is a block diagram of an information processing system 1200 including a magnetic device according to an example embodiment.

Referring to FIG. 13, the information processing system 1200 may include a nonvolatile memory system 1210, a modem 1220, a central processing unit (CPU) 1230, a random access memory (RAM) 1240, and a user interface 1250, which are electrically connected to a bus 1202.

The nonvolatile memory system 1210 may include a memory 1212 and a memory controller 1214. Data obtained through processing by the CPU 1230 or data input from the outside may be stored in the nonvolatile memory system 1210.

The nonvolatile memory system 1210 may include at least one of nonvolatile memories such as a magnetoresistive random access memory (MRAM), a phase-change random access memory (PRAM), a resistive random access memory (RRAM), a ferroelectric random access memory (FRAM), etc. At least one of the memory 1212 and the RAM 1240 may include the magnetic device according to the example embodiments described above with reference to FIGS. 1 to 9.

The information processing system 1200 may be applied to portable computers, web tablets, wireless phones, mobile phones, digital music players, memory cards, MP3 players, navigations, portable multimedia players (PMPs), solid state disks (SSDs), household appliances, and/or the like.

In methods of manufacturing magnetic devices according to example embodiments, in forming MTJ cells having a relatively fine size necessary to implement a more highly integrated magnetic device, a sacrificial mask pattern formed on an upper electrode layer is used as an etch mask instead of using a metal hard mask as an etch mask. After a variable resistance structure including a MTJ structure is formed by using the sacrificial mask pattern as the etch mask, an insulation spacer is formed, and by selectively removing the sacrificial mask pattern exposed through the insulation spacer, a contact space exposing the upper electrode is provided. Therefore, consumption of the upper electrode by an etching atmosphere is suppressed and/or prevented while the contact space is being formed on the upper electrode. Also, even when forming MTJ cells having a relatively fine size necessary to implement a more highly integrated magnetic device, the upper electrode is formed to a minimum thickness necessary for relatively high integration. As described above, even when the upper electrode is formed to a minimum thickness necessary for relatively high integration, a process margin of when the contact space is formed on the upper electrode is secured, and thus, a more stable connection is made between a wiring structure and the upper electrode in a subsequent process without the upper electrode being consumed and/or a tunnel barrier or magnetization layers disposed under the upper electrode being deteriorated due to the consumption.

While inventive concepts have been particularly shown and described with reference to example embodiments thereof, it will be understood that various changes in form and details may be made therein without departing from the spirit and scope of the following claims.

What is claimed is:

1. A semiconductor device comprising:
a variable resistance structure;
a wiring structure connected to the variable resistance structure; and
an insulation spacer surrounding a portion of the wiring structure and the variable resistance structure,
wherein the portion of the wiring structure includes
a conductive layer on the variable resistance structure, such that the insulation spacer surrounds the conductive layer, and
a continuous conductive barrier layer extending between the conductive layer and the variable resistance structure and further between the conductive layer and the insulation spacer.

2. The semiconductor device of claim 1, wherein
the variable resistance structure includes
a magnetic resistance element including a tunnel barrier,
a first magnetization layer on a first side of the tunnel barrier, and
a second magnetization layer on a second side of the tunnel barrier; and
the insulation spacer surrounds the tunnel barrier, the first magnetization layer, the second magnetization layer, and the portion of the wiring structure.

3. The semiconductor device of claim 1, wherein
the variable resistance structure includes
a magnetic resistance element,
a lower electrode connected to a first end of the magnetic resistance element, and
an upper electrode connected to a second end of the magnetic resistance element;
the portion of the wiring structure includes a contact plug connected to the upper electrode; and
the insulation spacer surrounds the magnetic resistance element, the upper electrode, and the contact plug.

4. The semiconductor device of claim 3, wherein
the wiring structure further includes a conductive line spaced apart from the upper electrode;
the contact plug is between the conductive line and the upper electrode;
the contact plug contacts the conductive line; and
the insulation spacer contacts the conductive line.

5. The semiconductor device of claim 1, wherein
the variable resistance structure includes
a magnetic resistance element,
a lower electrode connected to a first end of the magnetic resistance element, and
an upper electrode connected to a second end of the magnetic resistance element;
the portion of the wiring structure includes a conductive line connected to the upper electrode; and
the insulation spacer surrounds a portion of the conductive line, the magnetic resistance element, and the upper electrode.

6. The semiconductor device of claim 5, wherein
the conductive line includes an upper line part having a planar surface and extending linearly, the upper line part having a lower protrusion protruding from the upper line part toward the variable resistance structure; and
the insulation spacer surrounds the lower protrusion, the magnetic resistance element, and the upper electrode.

7. A semiconductor device comprising:
a substrate having a plurality of active areas, the plurality of active areas extending in parallel along a first direction;
a plurality of word lines in the plurality of active areas, the plurality of word lines extending along a second direction, the second direction intersecting the first direction;
at least one source line connected to a plurality of first active areas among the plurality of active areas;
a plurality of buried contact plugs connected to a plurality of second active areas among the plurality of active areas;
a plurality of variable resistance structures connected to the plurality of second active areas through the plurality of buried contact plugs;
a wiring structure connected to each of the plurality of variable resistance structures; and
an insulation spacer surrounding a portion of the wiring structure and at least one of the plurality of variable resistance structures.

8. The semiconductor device of claim 7, wherein
each of the plurality of variable resistance structures includes a magnetic resistance element, the magnetic resistance element including
a tunnel barrier,
a first magnetization layer on a first side of the tunnel barrier, and
a second magnetization layer on a second side of the tunnel barrier; and
the insulation spacer surrounds the tunnel barrier, the first magnetization layer, the second magnetization layer, and a portion of the wiring structure.

9. The semiconductor device of claim 7, wherein
the plurality of variable resistance structures are aligned in a row along the first direction; and
the wiring structure includes a conductive line extending along the first direction above the plurality of variable resistance structures, at least a portion of the conductive line contacting the insulation spacer.

10. The semiconductor device of claim 7, wherein
each of the plurality of variable resistance structures includes
a magnetic resistance element,
a lower electrode connected to a first end of the magnetic resistance element, and
an upper electrode connected to a second end of the magnetic resistance element;
the wiring structure includes a plurality of contact plugs, each of the plurality of contact plugs connected to an upper electrode of a corresponding variable resistance structure among the plurality of variable resistance structures; and the insulation spacer surrounds the plurality of contact plugs and the plurality of variable resistance structures.

11. The semiconductor device of claim 7, wherein the insulation spacer includes an integrated insulation spacer surrounding a pair of adjacent variable resistance structures from among the plurality of variable resistance structures and a pair of the plurality of contact plugs connected to the adjacent pair of variable resistance structures.

12. The semiconductor device of claim 7, wherein
each of the plurality of variable resistance structures includes
a magnetic resistance element,
a lower electrode connected to a first end of the magnetic resistance element, and
an upper electrode connected to a second end of the magnetic resistance element;
the wiring structure includes
a plurality of contact plugs, each of the plurality of contact plugs connected to an upper electrode of a corresponding variable resistance structure among the plurality of variable resistance structures, and
a bit line connected to the upper electrodes through the plurality of contact plugs;
the insulation spacer surrounds the plurality of contact plugs and the plurality of variable resistance structures; and
the insulation spacer contacts the bit line.

13. The semiconductor device of claim 7, wherein
each of the plurality of variable resistance structures includes
a magnetic resistance element,
a lower electrode connected to a first end of the magnetic resistance element, and
an upper electrode connected to a second end of the magnetic resistance element;
the wiring structure includes a bit line connected to the upper electrode of each of the plurality of variable resistance structures; and
the insulation spacer surrounds a portion of the bit line and the magnetic resistance element and upper electrode of each of the plurality of variable resistance structures.

14. The semiconductor device of claim 13, wherein the bit line directly contacts the upper electrode of each of the plurality of variable resistance structures.

15. The semiconductor device of claim 13, wherein
the bit line includes an upper line part having a planar surface and extending linearly, the upper line part having a plurality of lower protrusions protruding from the upper line part toward the upper electrodes of the plurality of variable resistance structures; and
the insulation spacer surrounds at least one of the plurality of variable resistance structures and at least one of the plurality of lower protrusions.

* * * * *